US006946858B2

(12) United States Patent
Matsuyama

(10) Patent No.: US 6,946,858 B2
(45) Date of Patent: Sep. 20, 2005

(54) METHOD AND APPARATUS FOR MEASURING PHOTOELECTRIC CONVERSION DEVICE, AND PROCESS AND APPARATUS FOR PRODUCING PHOTOELECTRIC CONVERSION DEVICE

(75) Inventor: Jinsho Matsuyama, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/627,923

(22) Filed: Jul. 28, 2003

(65) Prior Publication Data

US 2004/0056648 A1 Mar. 25, 2004

(30) Foreign Application Priority Data

Jul. 26, 2002 (JP) .................................. 2002-217662
Jul. 23, 2003 (JP) .................................. 2003-200388

(51) Int. Cl.$^7$ ............................................ G01R 31/00
(52) U.S. Cl. .................. 324/752; 324/158.1; 324/767
(58) Field of Search ............................ 324/750–769, 324/501; 356/222, 400, 401; 250/234; 136/243, 244, 255

(56) References Cited

U.S. PATENT DOCUMENTS 3,630,627 A  * 12/1971 Low et al. ................. 356/222
5,252,142 A     10/1993 Matsuyama et al. ........ 136/255
6,169,414 B1 *  1/2001 Yoshino et al. ............. 324/767

FOREIGN PATENT DOCUMENTS

| JP | 4-53271     | 8/1992  |
| JP | 6-105280    | 12/1994 |
| JP | 2002-252362 | 9/2002  |

OTHER PUBLICATIONS

H. Ossenbrink et al., "Errors In Current Voltage Measurements of Photovoltaic Devices Introduced By Flash Simulators", Apr. 8–12, 1991 Lisbon, Portugal, 10$^{th}$ European Photovoltaic Solar Energy Conference, pp. 1055–1057.

* cited by examiner

Primary Examiner—Vinh P. Nguyen
(74) Attorney, Agent, or Firm—Fitzpatrick, Cella, Harper & Scinto

(57) ABSTRACT

A measuring method for measuring current-voltage characteristics of a photoelectric conversion device by irradiating light to said photoelectric conversion device and a reference device corresponding to said photoelectric conversion device at the same time while detecting an irradiance of said light using said reference device, characterized in that a light responsive time constant of a irradiance detection circuit in which said reference device is used is adjusted so that said light responsive time constant of said irradiance detection circuit comes closer to a light responsive time constant of said photoelectric conversion device. An apparatus for practicing said measuring method.

25 Claims, 7 Drawing Sheets

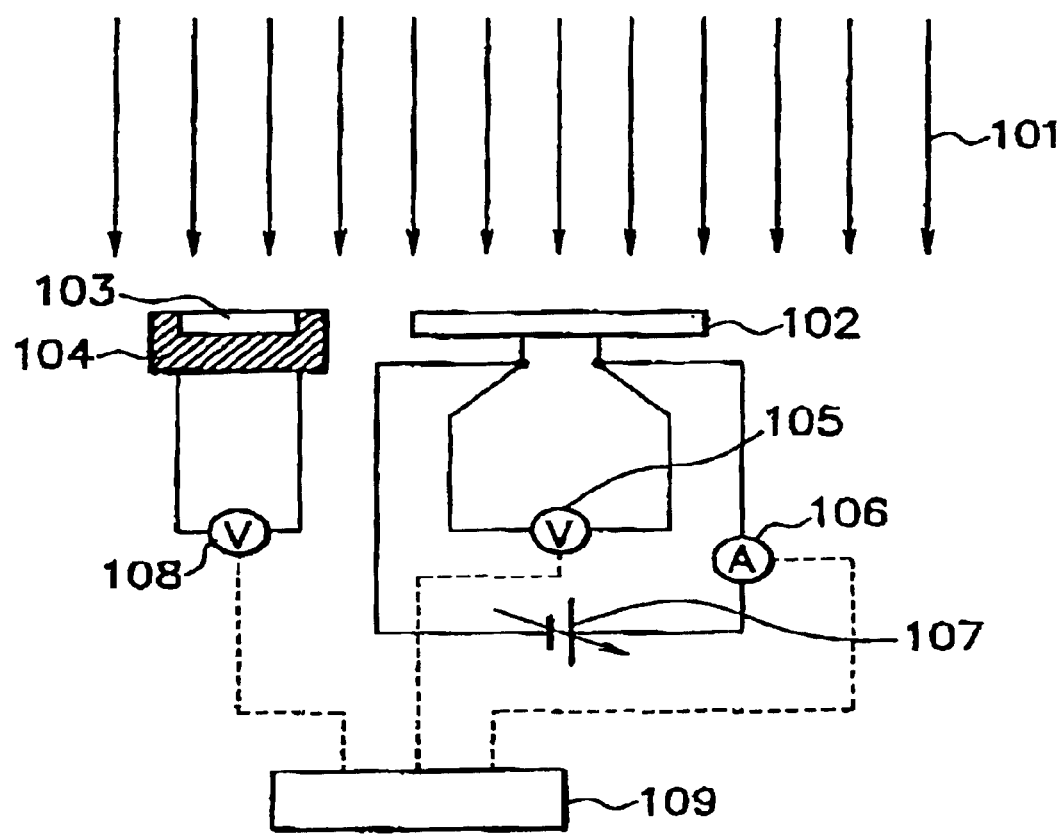
F I G. 1

F I G. 3
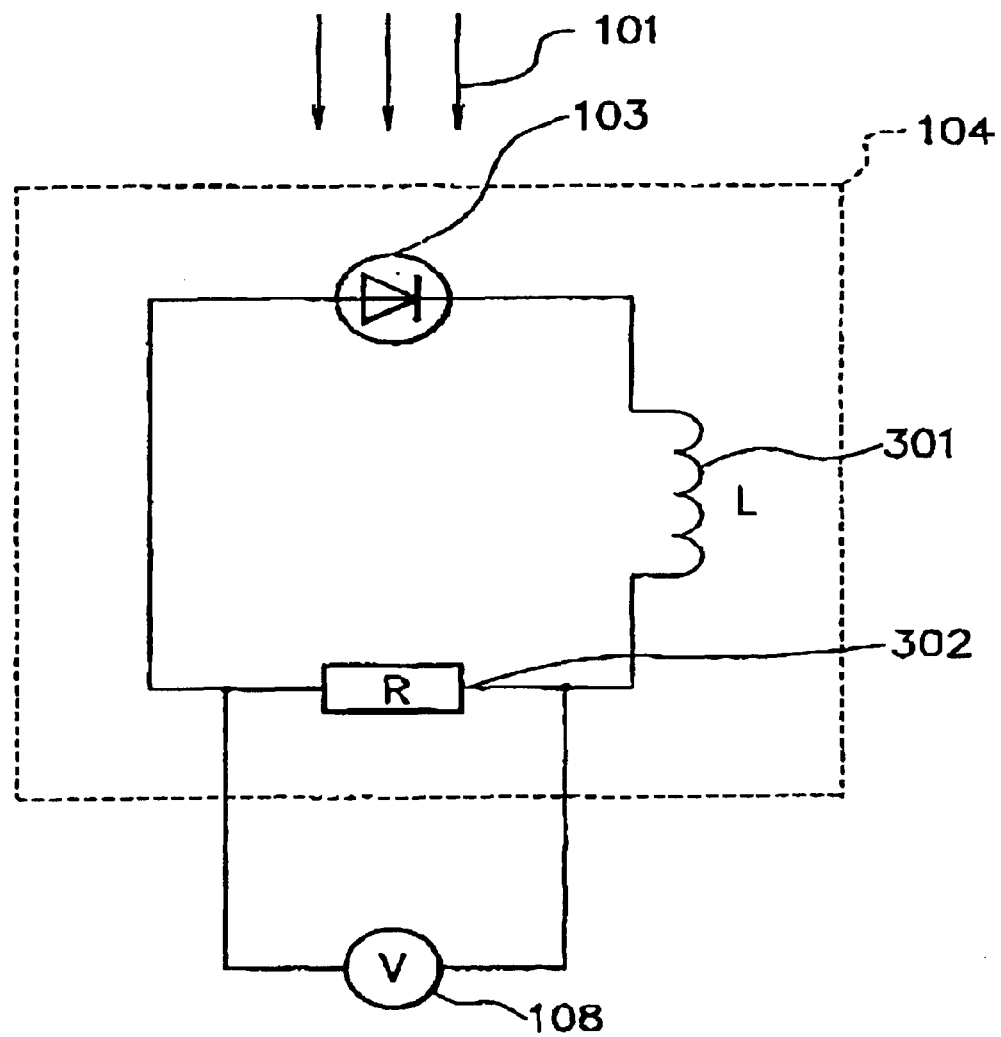

METHOD AND APPARATUS FOR MEASURING PHOTOELECTRIC CONVERSION DEVICE, AND PROCESS AND APPARATUS FOR PRODUCING PHOTOELECTRIC CONVERSION DEVICE

BACKGROUND OF THE INVENTION

1. Field of the Invention

The present invention relates to a measuring method for measuring current-voltage characteristics of a photoelectric conversion device such as solar cell, photovoltaic element or photosensor under irradiation of light. In the present invention, said photoelectric conversion device includes a photoelectric conversion apparatus prepared by connecting a plurality of photoelectric conversion devices in series or parallel connection. The present invention includes a process and an apparatus for producing a photoelectric conversion device.

2. Related Background Art

The photoelectric conversion characteristics (for example, efficiency, Voc, Isc, and fill-factor) of a photoelectric conversion device such as solar cell, photovoltaic device or photosensor can be obtained by measuring current-voltage characteristics thereof under irradiation of light. The measuring method in this case includes a measuring method wherein sunlight is used as the irradiation light and a measuring method wherein artificial light source (that is, pseudo sunlight) is used as the irradiation light.

By the way, in recent years, the practical use of photoelectric conversion devices having a large light receiving face has been progressed. Along with this, necessity to measure their current-voltage characteristics under irradiation of light at an irradiance of 1000 W/m$^2$ which is the normal irradiance of the sunlight has been increasing.

In order to precisely measure the current-voltage characteristics of a given photoelectric conversion device having a large light receiving face, it is necessary that light having an intensity of about 1000 W/m$^2$ is uniformly irradiated over said large light receiving face of the photoelectric conversion device. When an artificial light source is used in this case, it is necessary to use, for instance, a discharge lamp with a large electric power of several tens kilowatts (kW) per an irradiation area of 1 m$^2$ as such artificial light source. However, in order that steady light is generated by the discharge lamp with such large electric power, a large electric power is necessary to be steadily supplied, where the equipment for achieving this becomes unavoidably very large in terms of the scale. Thus, this measuring method is not realistic.

In view of this, there is known a measuring method to measure the current-voltage characteristics of a given photoelectric conversion device having a large light receiving face by using a pseudo sunlight source which generates not steady state light but pulsed light. Although no precise definition is present, as such pseudo sunlight source, there are known a long pulse solar simulator whose duration of pulsed light is more than 20 m/sec and a short pulse solar simulator whose duration of pulsed light is up to several msec. The measuring method of measuring the current-voltage characteristics of a given photoelectric conversion device having a large light receiving face by means of pulsed light in this way is more advantageous in comparison with the measuring method by means of steady state light. That is, in the latter method, there are disadvantages such that the temperature of the photoelectric conversion device is increased during the measurement and therefore, the temperature correction is necessitated. The former method is substantially free of such disadvantages.

The measuring technique by means of such long pulse solar simulator as above described is disclosed in, for instance. Japanese Patent Publication No. 4(1992)-53271 (hereinafter referred to as document 1) and Japanese Patent Publication No. 6(1994)-105280 (hereinafter referred to as document 2). Particularly, these documents 1 and 2 describe that by instantaneously flowing a large current which exceeds the rated current to a discharge lamp which is kept in a stand-by condition, it is possible to uniformly irradiate light with an intensity of about 1000 W/m$^2$ over the entire of a large light receiving face of a photoelectric conversion device at a pulse width of more than 20 msec during the time of measuring the current-voltage characteristics of the photoelectric conversion device.

As the foregoing short pulse solar simulator, a large area pulsed solar simulator produced by Spectrolab Company and a SPI-SUN simulator produced by Spire Company are commercially available. A measuring system using said large area pulsed solar simulator as the pseudo sunlight source which is produced by Spectrolab Company and a measuring system using said SPI-SUN simulator as the pseudo sunlight source which is produced by Spire Company are also commercially available.

Now, there is known a so-called multipulse method for measuring the current-voltage characteristics of a photoelectric conversion device by using said measurement system in which the short pulse solar simulator is used as the pseudo sunlight source. According to this multipulse method, I-V data (that is, a pair of current value data and voltage value data) at n points (n is an integer of more than 2) of the photoelectric conversion device can be obtained by a manner wherein n times pulsed lights are supplied over the light receiving face of the photoelectric conversion device while applying a series of prescribed voltages to the device, where I-V data at each of prescribed n points of the device in accordance with each pulsed light while sweeping the voltage applied after the measurement of the I-V data in each case.

As the peculiar problem in the case of using the short pulse solar simulator, a problem relating to the responsibility of the photoelectric conversion device is pointed out by H. Ossenbrink et al. in the report *"Errors in Current-Voltage Measurement of Photovoltaic Device Introduced by Flash Simulators"* in 10*th European Photovoltaic Solar Energy Conference P.* 1055 (hereinafter referred to as document 3). The problem described in the document 3 is such that in the case of the photoelectric conversion device whose static capacitance is large, when the speed to sweep the voltage applied to the photoelectric conversion device is made to be faster, especially the I-V curve (the current-voltage characteristic curve) is distorted. For the reason for this, the document 3 describes that this is due to a factor that as the photoelectric conversion device has a given static capacitance, when a prescribed voltage is applied thereto, phenomena similar to the charge-and-discharge phenomena in the condenser are occurred, and in the short pulse simulator, the duration of the pulsed light is short and because of this, the time allowed to measure the current-voltage characteristics of the photoelectric conversion device inevitably becomes to be short and this makes to shorten the time allowed to sweep the voltage applied to the photoelectric conversion device.

Thus, the problem relating to the responsibility which is described in the document 3 corresponds to that relating to the responsibility of the charge and discharge of the photoelectric conversion device. Therefore, it is considered that this problem can be solved basically by measuring the current value of the photoelectric conversion device after a sufficient time is elapsed in responding to the charge-and-discharge since the time when a prescribed voltage is applied to the photoelectric conversion device.

The previously mentioned documents 1 and 2 describe the presence of a problem similar to that described in the document 3 in the measuring technique by means of the long pulse solar simulator and also describe a solution of the problem in that by prolonging the time interval for the voltage applied to the photoelectric conversion device to be changed by way of prolonging the duration of the pulsed light, it makes possible to measure the current-voltage characteristics of the photoelectric conversion device whose responsive speed to the charge-and-discharge is tardy.

SUMMARY OF THE INVENTION

In view of the foregoing prior art, the present inventor conducted extensive studies through experiments in order to establish a measuring method which enables to precisely measure the current-voltage characteristics of a photoelectric conversion device to be inspected (this photoelectric conversion device will be hereinafter referred to as "inspective photoelectric conversion devices"). As a result, there was obtained findings that it is not sufficient merely to prolong the time interval for the voltage applied to the inspective photoelectric conversion device with consideration of the responsibility thereof to the charge-and-discharge but it is necessary to take a proper measure for the difference between the light responsibility of a reference device and that of the Inspective photoelectric conversion device. Detailed description will be made about this measure.

The reference device means a photoelectric conversion device whose structure is basically the same as that of the inspective photoelectric conversion device and which has been selected and calibrated based on the criterion stipulated in IEC 60904-2 or IEC 60904-6. The reference device can include a reference cell, a reference module, and the like.

Upon measuring the current-voltage characteristics of the inspective photoelectric conversion device, the irradiance of irradiation light (light irradiated) is detected by comparing the value of a short-circuit current of the reference device with the previously calibrated value thereof.

In the case where an artificial light source of steady state light is used, because the irradiance has been previously controlled to be constant, it is possible that the irradiance of the artificial light source is detected before or after the measurement of the current-voltage characteristics of the inspective photoelectric conversion device. However, in the case where an artificial light source of pulsed light is used or the sunlight is used, because the irradiance is not constant, it is necessary to detect the irradiance by the reference device simultaneously with the measurement of the current-voltage characteristics of the inspective photoelectric conversion device.

However, in the case where the detection of the irradiance is performed during the time of measuring the current-voltage characteristics of the inspective photoelectric conversion device, a basic unit cell whose light receiving area is small and which is engaged neither in series connection nor in parallel connection is used in many cases. This is due to a factor that the area of the light irradiation face by the artificial light source or that of a frame bed of tracking the sunlight is limited and also a factor that the size of the reference device which can be calibrated in authorized calibration inspection is restricted.

Besides, depending on the kind of an inspective photoelectric conversion device, there will be an occasion that it is difficult to obtain a reference device whose characteristics are stable with time and which is corresponding to the inspective photoelectric conversion device, and because of this, there will be a case where the inspective photoelectric conversion device and the reference device are different from each other in terms of the material. When the inspective photoelectric conversion device and the reference device are different from each other in terms of the material, the area or the series or parallel connection, a difference will be occurred between the reference device which serves to detect the irradiance and the inspective photoelectric conversion device with respect their light responsibility of the output during the measurement in many cases.

In the present invention, the time constant for the responsibility of the short-circuit current of the reference device or the inspective photoelectric conversion device versus a change in the irradiance of light irradiated is indicated to be a light responsive time constant.

In the case where the light responsive time constant of the reference device differs from that of the inspective photoelectric conversion device, under light those irradiance is changed such as pulsed light or the sunlight, there will be occurred a problem such that it is difficult to precisely detect an effective irradiance for the inspective photoelectric conversion device and because of this, it is difficult to precisely measure the current-voltage characteristics of the inspective photoelectric conversion device. This problem is different from the foregoing problem relating to the responsibility to the charge and discharge of the inspective photoelectric conversion device but is corresponding to the problem relating to the responsibility of the inspective photoelectric conversion device to light irradiated thereto.

This problem becomes significant when a photoelectric conversion device whose light responsive time constant is large such as a photoelectric conversion device having a photoelectric conversion layer comprising a semiconductor thin film is subjected to the measurement of the current-voltage characteristics using pulsed light. Even when the time interval to change the voltage applied to the photoelectric conversion device is prolonged using the long pulse solar simulator, there is often afforded such an I-V curve formed by plotting the measured current-voltage characteristics as shown in FIG. 7 which is accompanied by distortions or roughness in comparison with a natural I-V curve afforded under steady state light.

The present inventor conducted extensive studies through experiments of the cause of entailing such distortions or roughness in the I-V curve. As a result, there was obtained a finding that the distortions and roughness are occurred mainly due to a factor that because of a difference between the light responsive time constant of the inspective photoelectric conversion device and that of the reference device, an error was occurred in the detected value of the effective irradiance of the pulsed light. The present invention has been accomplished based on this finding.

Accordingly, the present invention is aimed at solving the foregoing problems.

Another object of the present invention is to provide a measuring method which enables to precisely measure the current-voltage characteristics of a photoelectric conversion device even under condition where light whose intensity is unstable such as pulsed light or the sunlight is irradiated.

A further object of the present invention is to provide a measuring apparatus which enables to precisely measure the current-voltage characteristics of a photoelectric conversion device even under condition where light whose intensity is unstable such as pulsed light or the sunlight is irradiated.

A still further object of the present invention is to provide a process and an apparatus for producing a photoelectric conversion device.

A typical embodiment of the measuring method of the present invention is directed to a method for measuring current-voltage characteristics of a photoelectric conversion device by irradiating light to said photoelectric conversion device and a reference device corresponding to said photoelectric conversion device at the same time while detecting an irradiance of said light using said reference device, characterized in that a light responsive time constant of an irradiance detection circuit in which said reference device is used is adjusted so that said light responsive time constant of said irradiance detection circuit approximates to a light responsive time constant of said photoelectric conversion device.

Said light used in the measuring method of the present invention is preferred to comprise light whose irradiance is varied with time. As such light, there can be mentioned pulsed light by an artificial light source and the sunlight.

In the measuring method of the present invention, it is possible that by using an integrating circuit in the irradiance detection circuit in which the reference device is used, the light responsive time constant of this irradiance detection circuit is increased so as to come closer to the light responsive time constant of the photoelectric conversion device. As the integrating circuit, it is possible to use an RC integrating circuit or an RL integrating circuit. Separately, the integrating circuit may contain a component comprising a semiconductor element or another photoelectric conversion device which is different from the reference device and also different from the inspective photoelectric conversion device.

In the measuring method of the present invention, it is possible that the light responsive time constant of the irradiance detection circuit in which the reference device is used is continuously changed.

In this case, it is preferred that the light responsive time constant of the irradiance detection circuit in which the reference device is used is made to come closer to that of the photoelectric conversion device so that a difference between a normalized short-circuit current value by the irradiance detection circuit in which the reference device is used and a normalized short-circuit current value of the photoelectric conversion device, which are measured at any optional timing during the time when the current-voltage characteristics of the photoelectric conversion device are being measured, to fall within a range of ±3%.

The measurement of the current-voltage characteristics of the photoelectric conversion device (that is, the inspective photoelectric conversion device) in the measuring method of the present invention is performed, for example, in the following manner.

The light responsive time constant of the irradiance detection circuit in which the reference device is used is made to come closer to the light responsive time constant of the photoelectric conversion device in comparison with a light responsive time constant of said reference device itself.

As a result of making the light responsive time constant of the irradiance detection circuit in which the reference device is used to come closer to that of the photoelectric conversion device, even when the irradiation light is varied with time, a change in the effective irradiance which complies with a given light responsive speed of the photoelectric conversion device can be precisely measured.

The measured current-voltage characteristics of the photoelectric conversion device are subjected to the correction with respect to the irradiance by means of the detected irradiance. Because the measured value of the irradiance becomes to be accurate, the correction with respect to the irradiance also becomes to be accurate. As a result, the current-voltage characteristics of the photoelectric conversion device after the correction become to be accurate.

A typical embodiment of the measuring apparatus is directed to an apparatus for measuring current-voltage characteristics of a photoelectric conversion device, comprising at least a light irradiation means for irradiating light to said photoelectric conversion device and a reference device corresponding to said photoelectric conversion device at the same time, an irradiance detection circuit in which said reference device is used, a means for measuring the current-voltage characteristics of said photoelectric conversion device, and a means for changing a light responsive time constant of said irradiance detection circuit in which said reference device is used.

The light irradiation means in the measuring apparatus of the present invention may comprise a means having an artificial light source to generate pulsed light.

The measuring apparatus of the present invention may further comprise a means for installing said photoelectric conversion device and said reference device outdoors so that they can face to the sunlight at a substantially equal angle.

The irradiance detection circuit in which the reference device is used in the measuring apparatus of the present invention may have an integrating circuit. As the integrating circuit, it is possible to use an RC integrating circuit or an RL integrating circuit.

Separately, the integrating circuit may contain a component comprising a semiconductor element or another photoelectric conversion device which is different from the reference device and also different from the inspective photoelectric conversion device.

The means for changing the light responsive time constant of the irradiance detection circuit in which the reference device is used in the measuring apparatus of the present invention may be a means for continuously changing said light responsive time constant.

A typical embodiment of the process for producing a photoelectric conversion device in the present invention comprises a step (a) of forming at least one photoelectric conversion portion on a substrate to obtain a photoelectric conversion device and a step (b) of measuring the current-voltage characteristics of said photoelectric conversion device, characterized in that said step (b) includes a step of providing an irradiance detection circuit in which a reference device corresponding to said photoelectric conversion device is used and a step of adjusting a light responsive time constant of said irradiance detection circuit so that said light responsive time constant of said irradiance detection circuit comes closer to a light responsive time constant of said photoelectric conversion device.

A typical embodiment of the apparatus for producing a photoelectric conversion device in the present invention comprises a means (i) for forming at least one photoelectric conversion portion on a substrate to obtain a photoelectric conversion device and a means (ii) for measuring the current-voltage characteristics of said photoelectric conversion device, characterized in that said means (ii) has a means for irradiating light to said photoelectric conversion device and a reference device corresponding to said photoelectric conversion device at the same time, an irradiance detection circuit in which said reference device is used, a means for measuring the current-voltage characteristics of said photoelectric conversion device, and a means for changing a light responsive time constant of said irradiance detection circuit in which said reference device is used.

BRIEF DESCRIPTION OF THE DRAWINGS

FIG. 1 is a schematic diagram schematically illustrating the constitution of an example of a measuring system of the present invention.

FIG. 3 is a schematic diagram illustrating the constitution of an example of an irradiance detection circuit in which a basic RL integrating circuit is used in the present invention.

DESCRIPTION OF THE INVENTION AND PREFERRED EMBODIMENTS

Figure 2:
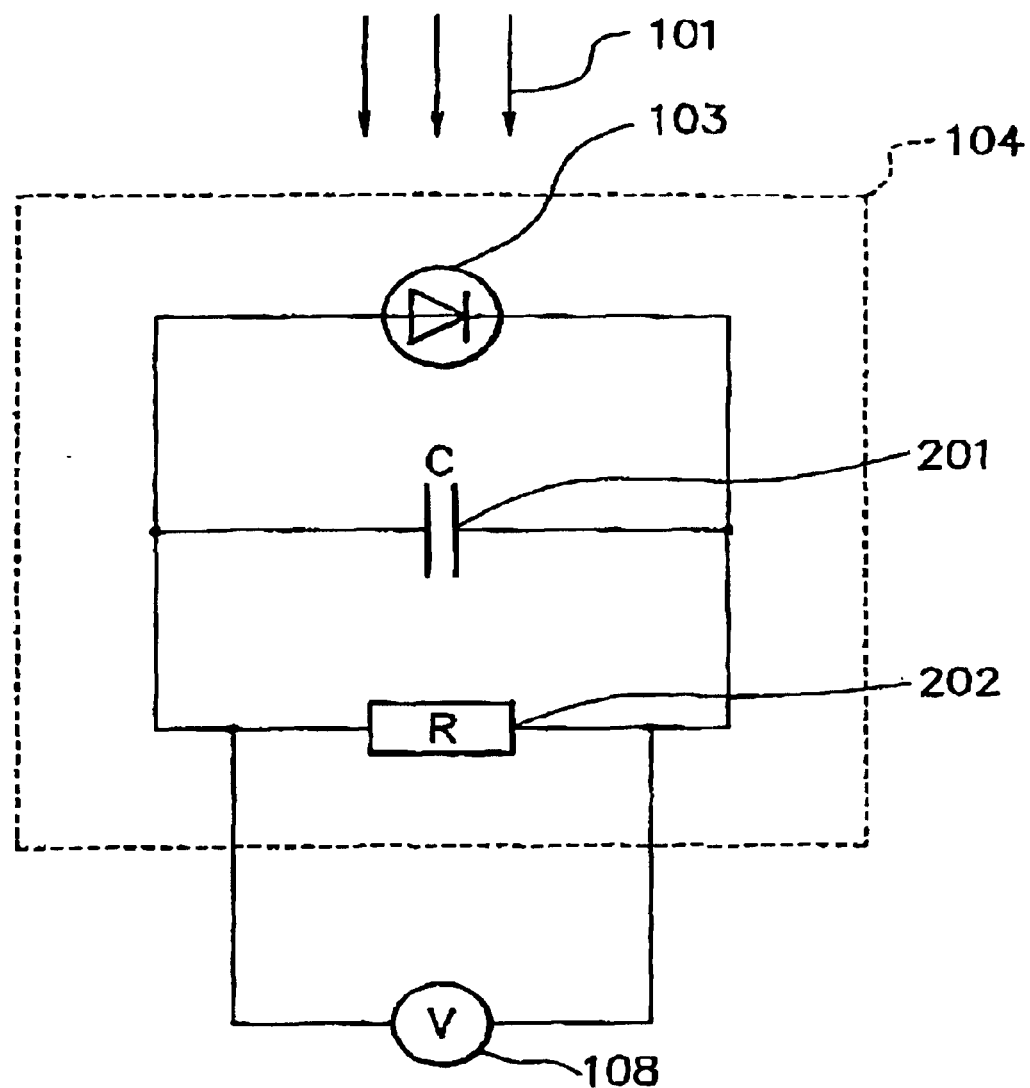
FIG. 2 is a schematic diagram illustrating the constitution of an example of an irradiance detection circuit in which a basic RC integrating circuit is used in the present invention.

In the following, preferred embodiments of the present invention will be detailed with reference to the drawings. It should be understood that the present invention is not restricted by these embodiments.

FIG. 1 is a schematic diagram illustrating the constitution of an example of a measuring system for measuring current-voltage characteristics of a photoelectric conversion device in the present invention.

In FIG. 1, reference numeral 101 indicates irradiation light, reference numeral 102 a photoelectric conversion device which is subjected to the measurement of current-voltage characteristics thereof, reference numeral 103 a reference device, reference numeral 104 an irradiance detection circuit in which the reference device 103 is used, reference numeral 105 a voltage detection means for detecting a voltage value of the photoelectric conversion device 102, reference numeral 106 a current detection means for detecting a current value of the photoelectric conversion device 102, reference numeral 107 a voltage variable means, reference numeral 108 an output detection means for detecting an output of the irradiance detection circuit 104, and reference numeral 109 a measurement control/data processing means.

In FIG. 1, solid lines (excluding solid lines 101 indicating irradiation light) indicate electric connection, and dotted lines indicate connection with respect to data and demand of measurement control.

In the following, description will be made of each constituent of the measuring system shown in FIG. 1.

[Photoelectric Conversion Device]

The photoelectric conversion device 102 which is subjected to the measurement of current-voltage characteristics thereof can include photovoltaic devices such as solar cells, photodiodes and the like, photosensors, electrophotographic photosensitive members, and the like. Other than these, wet-type solar cells such as photochemical sensitization type solar cells can be illustrated.

The photoelectric conversion function of these photoelectric conversion devices is exhibited mainly by a semiconductor junction they have. The semiconductor junction includes p-n junction, p-i-n junction, Schottky junction, MIS type junction, or the like.

Such semiconductor junction comprises a semiconductor material which is crystalline, polycrystalline, microcrystalline, or amorphous. As such semiconductor material, there can be mentioned materials and compounds of elements belonging to group IV of the periodic table such as Si, SiC, SiGe, C, Ge, and the like; compounds of elements belonging to groups III and V of the periodic table such as GaAs, AlGaAs, InP, InSb, and the like; compounds of elements belonging to groups II and VI of the periodic table such as ZrSe, ZnO, CdS, CdTe, $Cu_2S$, and the like; compounds of elements belonging to groups I, III and VI such as $CuInSe_2$, $CuInS_2$, and the like; organic semiconductor materials; and mixed materials of the above-mentioned compounds and materials.

Separately, the photoelectric conversion device 102 may be a photoelectric conversion member prepared by connecting a plurality of photoelectric conversion devices in series or parallel connection or a photoelectric conversion apparatus comprising said photoelectric conversion member accommodated in an environment-resistant vessel.

Of the above-mentioned photoelectric conversion devices, those in which thin film semiconductors are used are tardy with respect to light responsibility, that is, they are large with respect to light responsive time constant. It is difficult to precisely measure their current-voltage characteristics by the conventional measuring method because their light responsive time constant is liable to greatly differ from that of the reference device and therefore, unacceptable errors are liable to occur in measured values of the current-voltage characteristics. However, according to the measuring method of the present invention, their current-voltage characteristics can precisely measured without such unacceptable errors in the measured values.

The photoelectric conversion device which is subjected to the measurement by the measuring method of the present invention is desired to be one whose dependency of the current-voltage characteristics to the irradiance of irradiation light has been previously determined (this dependency will be hereinafter referred to as irradiance dependency). In this case, the correction of the measured current-voltage characteristics with respect to the irradiance becomes to be more accurate. Particularly, it is preferred that the series resistance component Rs of the photoelectric conversion device has been previously determined or it can be estimated from a photoelectric conversion device which is the same as the photoelectric conversion device in terms of the constitution.

Further, the photoelectric conversion device which is subjected to the measurement by the measuring method of the present invention is desired to be one those temperature coefficients with respect the current-voltage characteristics has been previously determined. In more detail, it is desired that the temperature coefficient of the open circuit voltage, that of the short-circuit current, and that of the fill factor have been previously determined.

In the case where the temperature coefficient of the photoelectric conversion device itself is difficult to be measured, it is possible to use a representative value of the already determined temperature coefficients of photoelectric conversion devices which are the same as the photoelectric conversion device in terms of the constitution.

When the photoelectric conversion device is subjected to the measurement by the measuring method of the present invention, it is preferred that the photoelectric conversion device is adjusted to have a temperature of 25±2° C. In the case where it is difficult to adjust the photoelectric conversion device to have said temperature, it is necessary to obtain the characteristics at 25° C. by performing the temperature correction using the foregoing temperature coefficients.

[Irradiation Light]

The light used an the measuring method of the present invention may be the sunlight or light from an artificial light source. As the artificial light source, it is preferred to use a pseudo sunlight light source which will be described later.

The light whose irradiance is varied with time in the present intention means light that the time-variable rate of the irradiance within a prescribed time [ΔE (t)] which is defined by the following equation (1) is beyond ±1%.

$$\Delta E(t) = \pm (E\max - E\min)/(E\max + E\min) \times 100 \quad (1)$$

Emax: a maximum value of the irradiance within the prescribed time
Emin: a minimum value of the irradiance within the prescribed time The prescribed time indicates a measurement time of all data, including a time during which current-voltage characteristics are measuring and a time consumed in detecting the irradiance.

Thus, steady state light of a solar simulator that the time-variable rate of the irradiance is less than ±1% and the sunlight at the time of fine weather that the time-variable rate of the irradiance is less than ±1% are not regarded as the light that the irradiance is varied with time.

As specific examples of the light that the irradiance is varied with time, there can be mentioned pulsed light, the sunlight whose irradiance is not stable, and steady state light whose irradiance is not stable.

It is desired that the irradiance of the irradiation light is measured preferably in a range of from 500 to 1500 $W/m^2$ or more preferably in a range of from 800 to 1200 $W/m^2$.

The closer to 1000 $W/m^2$ the irradiance is, the smaller the quantity of the correction with respect to the irradiance is, where the error by this correction becomes to be smaller.

In the case where the sunlight is used as the irradiation light, when the weather is fine where the irradiance of the sunlight is stable, substantially no problem is entailed even by the conventional measuring method. The measuring method of the present invention is effective when the weather is cloudy there the irradiance is varied.

[Pseudo Sunlight Source]

In the case where the pseudo sunlight source is used, a conventional solar simulator is suitable. As the lamp of the light source in the solar simulator, a Xenon lamp and a metal halide lamp can be desirably used. The lighting method may be continuous lighting (steady state light) or pulsated lighting (pulsed light).

The measuring method of the present invention is particularly desirably applied in the case where a solar simulator in which pulsed light is used is adopted, because in the case of using pulsed light, the variation per a unit time of the irradiance (a time-differentiated value of the irradiance) is large and the influence of the difference between the light responsive time constant of the photoelectric conversion device and that of the reference device is large.

The difference between the light responsive time constant of the photoelectric conversion device and that of the reference device becomes to be large also in the case where the foregoing time-variable rate of the irradiance [ΔE(t)] is large. Hence, the effectiveness of the measuring method of the present invention becomes to be significant in this case.

As the pulse type solar simulator, any of the foregoing long pulse solar simulator and the foregoing short pulse solar simulator can be suitably used.

[Reference Device]

As the reference device, it is basically desired to use a photoelectric conversion device whose constitution is the same as that of the inspective photoelectric conversion device which is subjected to the measurement by the measuring method of the present invention. However, it is possible to use a photoelectric conversion device constituted by a material which is different from the constituent material of the inspective photoelectric conversion device, as the reference device. In that case, it is desired for the photoelectric conversion device as the reference device to be adjusted by a filter or the like so as to have a spectral response which is similar to that of the inspective photoelectric conversion device.

By doing in this way, when the irradiance of irradiation light is measured by using this photoelectric conversion device as the reference device, the error due to the spectrum of the irradiation light and the spectral response of the inspective photoelectric conversion device can be minimized. This makes the measured results of the current-voltage characteristics of the inspective photoelectric conversion device to be desirably accurate.

It is desired for the reference device to be previously treated so that the characteristics thereof are stable with time. Particularly, by stabilizing the reference device to be stable against light, heat, moisture and the like, the reliability of a calibrated value of the reference device in a standard test condition (STC), which will be described below, is improved. This makes the measurement of the current-voltage characteristics of the photoelectric conversion device (the inspective photoelectric conversion device) to be precise. And this also makes it possible to enlarge the time interval to remeasure the calibrated value in the standard test condition.

The standard test condition herein generally means the standard which has been introduced in order to standardize the conditions to measure the current-voltage characteristics of photoelectric conversion devices, and which stipulates the test conditions of the intensity and spectrum of light irradiated, the temperature of a photoelectric conversion device, and the like. Specifically, in JIS C 8960, there is stipulated as follows:

temperature of solar cell: 25 ° C.,
 spectrum of light to be irradiated: standard sunlight,
  (The standard sunlight is of ideal sunlight spectrum with AM (air mass) 1.5 which is stipulated in JIS C 8911.)
  and
 irradiance of light to be irradiated: 1000 $W/m^2$.

The reference device is desired to be one whose short-circuit current in the standard test condition have been measured in advance.

The measurement of the short-circuit current in the standard test condition may be carried out in accordance with the method described in the specification of IEC 60904-2: photovoltaic devices part 2 requirements for reference solar cells or in the specification of IEC 60904-6: photovoltaic devices part 6 requirements for reference solar modules. The value measured by the public agency in accordance with the prescribed specification is called "calibrated value".

The short-circuit current of the reference device in the standard test condition is desired to have been measured as the calibrated value by the public agency.

Separately, it is possible to adopt such a manner that a plurality of reference devices of the same constitution are divided into two groups, that is, (a) primary working reference devices and (b) secondary working reference devices, the primary working reference devices (a) are calibrated by the public agency, and private sectors use the secondary working reference devices (b) by referring to the calibrated values of the primary working reference devices (a).

Now, as the reference device, it is preferred to use a reference device (a photoelectric conversion device) that the temperature coefficient with respect to the short-circuit current has been determined. In the case where it is difficult to measure the temperature coefficient of the reference device itself, it is possible to use the already known temperature coefficient of other photoelectric conversion device whose constitution is the same as that of the photoelectric conversion device as the reference device.

In the case where a given photoelectric conversion device to be inspected is subjected to the measurement by the measuring method using a proper reference device comprising a photoelectric conversion device corresponding to said inspective photoelectric conversion device, it is preferred that the reference device is adjusted to have a temperature of 25±2° C. When it is difficult to adjust the temperature of the reference device to fall in said range, it is necessary to obtain the short-circuit current at 25° C. by using the foregoing temperature coefficient and performing the temperature correction in accordance with the known temperature correction method described in the specification.

Besides, the relationship between the spectral response of the reference device and that of the photoelectric conversion device is desired to be such that the Mismatch coefficient Mn computed by the following equation (2) falls in a range of from 0.96 to 1.02.

$$Mn = \int Eo(\lambda)Qr(\lambda)d\lambda / \int Et(\lambda)Qr(\lambda)d\lambda \times \int Et(\lambda)Qs(\lambda)d\lambda / \int Eo(\lambda)Qs(\lambda)d\lambda \quad (2)$$

where
  $Eo(\lambda)$: spectral irradiance of reference sunlight
  $Et(\lambda)$: spectral irradiance of irradiation light
  $Qr(\lambda)$: spectral response of reference device
  $Qs(\lambda)$; spectral response of photoelectric conversion element In the case where the irradiance of the irradiation light is positionally uneven as in the case where the artificial light source, it is desired that the power generation portion area of the reference device is approximate to that of the photoelectric conversion device preferably in a range of less than ±20%, more preferably in a range of less than ±10%, or most preferably in a range of less than ±5%. When the power generation portion area of the reference device and that of the photoelectric conversion device are approximate in this way, the error due to the positional unevenness of light irradiated is greatly diminished.

In the case where the measurement is carried out by the sunlight whose irradiance is substantially free from positional unevenness or in the case where the foregoing secondary working reference device (b) is used for monitoring the irradiance of the irradiation light during the measurement of the current-voltage characteristics of the photoelectric conversion device, it is not necessary that the power generation portion area of the reference device is approximate to that of the photoelectric conversion device.

However, in the case there the secondary working reference device (b) is used, it is preferred that the secondary working reference device is fixed to a prescribed position of the light irradiation area. Separately, when the spectral irradiance of the irradiation light or the positional unevenness of the spectrum is changed, the value transference from the primary working reference device (a) to the secondary working reference device (b) is necessary to be done over again.

[Irradiance Detection Circuit]

The irradiance detection circuit (104, see FIG. 1) is the most important factor in the present invention. The irradiance detection circuit comprises the foregoing reference device (103, see FIG. 1), a means for changing the light responsive time constant and a current detection circuit. The irradiance detection circuit basically has a function to detect an irradiance based on a short-circuit current of the reference device.

The current detection circuit may be designed by means of a known technique using a shunt resistor for detecting electric current, a voltmeter and the like. Here, the current detection circuit is not engaged to measure current voltage characteristics of the reference device. Therefore, strictly, the current detection circuit is incapable of detecting a short-circuit current itself. However, as the current detection circuit is possible to detect an electric current which substantially corresponds to the short-circuit current, no problem is entailed in view of the detection of the irradiance. In any case, it is desired that the electric current-detecting shunt resistor is made to have a resistance value Rdet so that the detected electric current value becomes to be greater than a value of 0.99 time the short-circuit current Iref to steady state light.

That is, when the difference between said Iref and said Idet is made to be ΔIref, a forward bias voltage which is applied to the reference device by the electric current-detecting shunt resistor is made to be Vdet, and a shunt resistance of the reference device itself is made to be Rrsh, the following equation (3) is established.

$$\Delta Iref = Vdet/Rrsh = Rdet \times Idet/Rrsh \quad (3)$$

When this equation (3) is deformed, the following equation (4) is obtained.

$$Rdet/Rrsh = \Delta Iref/Idet = \Delta Iref/(Iref - \Delta Iref) \approx \Delta Iref/Iref \leq 0.01 \quad (4)$$

From this equation (4), it is understood that the resistance value Rdet is preferred to be less than 1% of the shunt resistance Rrsh.

As the means to measure a voltage applied to the Rdet, it is possible to use a known voltage-measuring means such as a voltmeter or an Analog/Digital converting board (an A/D board). Alternatively, it is possible that the detected electric current Idet is directly measured by a known electric current-measuring means. In that case, specifically, for instance, it is required that the Rdet is made to satisfy the equation (4) by making the internal resistance for detecting an electric current in the electric current-measuring means to be a fixed value Rdet.

Now, as described in the above, in the case where the irradiance of the irradiation light is monitored during the measurement of the current-voltage characteristics of the photoelectric conversion device, the foregoing secondary working reference device (b) whose area is relatively small is used in many cases. Such reference device has a light responsive time constant which is smaller than that of the inspective photoelectric conversion device in many cases.

Therefore, as the means for changing the light responsive time constant, a means capable of greatly changing the light responsive time constant is used in many cases. As such means capable of greatly changing the light responsive time constant, an integrating circuit capable of enlarging the time constant of an output waveform with respect to the input waveform is desirably used.

As most basic examples of such integrating circuit, there can be mentioned an RC integrating circuit in which a resistor R and a condenser C are used as shown in FIG. 2 and an RL integrating circuit in which an resistor R and an inductor L are used as shown in FIG. 3. Each of FIGS. 2 and 3 is a schematic enlarged view of a portion including the irradiance detection circuit 104 of FIG. 1. In each of FIGS. 2 and 3, a portion encircled by a dotted line corresponds to the irradiance detection circuit 104 of FIG. 1.

In FIGS. 2 and 3, reference numerals 101, 103, 104, and 108 indicate respectively irradiation light, a reference device, an irradiance detection circuit in which the ref rence device 103 is used, and a means for detecting an output of the irradiance detection circuit 104, as well as in FIG. 1. Besides, in FIG. 2, reference numeral 201 indicates a condenser and reference numeral 202 a resistor. Similarly, in FIG. 3, reference numeral 301 indicates an inductor and reference numeral 302 a resistor. In these integrating circuits shown in FIGS. 2 and 3, for the resistor R (202, 302) which is connected with the reference device (103) in parallel connection, at least part thereof may be made so as to serve also as the above-described electric current-detecting shunt resistor Rdet.

In any case, it is considered that the input into the integrating circuit is an electric current outputted from the reference device (103). Here the resistor R (202, 302) may comprise a plurality of resistors connected with each other in series connection. Separately, it is possible that a plurality of basic circuit constitutions which are similar 3 to the above basic circuit constitutions shown in FIGS. 2 and 3 are combined to establish a complicated integrating circuit. Besides, it is possible that the basic circuit devices, the resistor R, the condenser C, and the inductor in the above integrating circuit are equivalently realized depending on semiconductor devices or circuits in which semiconductor devices are used. Further, it is possible to amplify the output using various amplifiers.

As the device to realize the condenser of the RC integrating circuit, it is possible to use an ordinary photoelectric conversion device having a semiconductor junction, where the photoelectric conversion device has an electrostatic capacity and it can function as a condenser. In this case, the photoelectric conversion device which functions as the condenser is connected with the reference device in parallel connection. In addition, it is necessary to take a measure to prevent the irradiation light from impinging in the photoelectric conversion device as the condenser so that the photocurrent is not influenced to the short-circuit current of the reference device.

In any case, due care should be make so that the addition of the above integrating circuit does not greatly hinder the linearity of the correlation of the output P of the irradiance detection circuit to the irradiance E of the irradiation light. As long as the sensitivity of the variation of the output P to the variation of the irradiation light is not decreased, somewhat deviation from the linearity is allowable. It is desired that at least the irradiance E is in a range of from 800 to 1200 W/m2 and the linearity of the output P to the irradiance E is maintained to an extent which is not problematic in the correction with respect to the irradiance.

It is desired that the output of the irradiance detection circuit is outputted in a voltage. Therefore, as the detection means to detect the output of the irradiance detection circuit, it is possible a known voltage detection means which will be described later.

In the following, description will be made of the adjustment of the light responsive time constant of the irradiance detection circuit by the integrating circuit.

For instance, when the light responsive time constant is made to be $\tau ref$, the light responsive time constant $\tau det$ of the irradiance detection circuit in the case where the foregoing simple RC integrating circuit is used can be approximately expressed by the following equation (5).

$$\tau det = \tau ref + RC \qquad (5)$$

Here, when the light responsive time constant of the inspective photoelectric conversion device is made to be $\tau sam$, it is sufficient that the resistance value R and the capacity of the condenser C of the RC integrating circuit are decided so as to satisfy the following equation (6)

$$\tau ref + RC = \tau sam \qquad (6)$$

In the case of the simple RL integrating circuit, the above equation (5) and the above equation (6) approximately become to be respectively such expressed by the following equation (7) and such expressed by the following equation (8).

$$\tau det = \tau ref + L/R \qquad (7)$$

$$\tau ref + L/R = \tau sam \qquad (8)$$

In the case of the complicated integrating circuit, it cannot be expressed by such simple equations as above described. But basically the concept is the same as in the above, therefore, it is possible to design so that the light responsive time constant of the irradiance detection circuit comes closer to that of the photoelectric conversion device. Here, the light responsive time constant $\tau ref$ of the reference device and the light responsive time constant $\tau sam$ of the photoelectric conversion device are corresponding to the time constants of the photoelectric conversion of the semiconductor junction, specifically they means time constants from the step where photocarriers are generated by the light impinged in the semiconductor junction until the step where said photocarriers are diffused to the opposite poles, followed by being outputted from the two poles as electric current. In this way, the time constants of the photoelectric conversion of the semiconductor junction comprise a plurality of steps, which are therefore difficult to be expressed by a simple equation.

However, for instance, in the case of semiconductor materials comprising the same element or compound, when a semiconductor junction formed by amorphous semiconductors comprising said semiconductor materials is compared with a semiconductor junction formed by single crystal semiconductors comprising said semiconductor materials, it is considered that the photocarrier mobility $\mu$ or/and the lifetime $\tau$ of the former are smaller than those of the latter, and therefore, the light responsive time constant of the former is lager.

Now, in practice, the values of the above R, C, and L will be sometimes difficult to designed merely by the computation, particularly for instance, as in the case where the foregoing τref and τsam are difficult to be obtained merely by the computation.

In such a case, proper values of the R, C, L and the like can be obtained by an experimental manner as will be described below That is, an output of the irradiance detection circuit in which the reference device is used and an output of the inspective photoelectric conversion device are measured by an oscilloscope having a plurality of channels, where they are indicated at the same time. Here, as the output of the photoelectric conversion device, it is desired to use a voltage value obtained by converting the short-circuit current of the photoelectric conversion device into a voltage value by means of a shunt resistor selected in the same manner as in the foregoing case of the reference device. Then, light whose intensity will be varied with time, specifically for example, pulsed light is irradiated to the reference device and the photoelectric conversion device, and an output waveform of the reference device and that of the photoelectric conversion device are compared by the oscilloscope. Successively the two output waveforms are normalized separately by the value $1_0$ at the time when the irradiance E is a certain value (for example, 1000 W/m$^2$) and the resultants are indicated as shown in FIG. 4.

Figure 4:
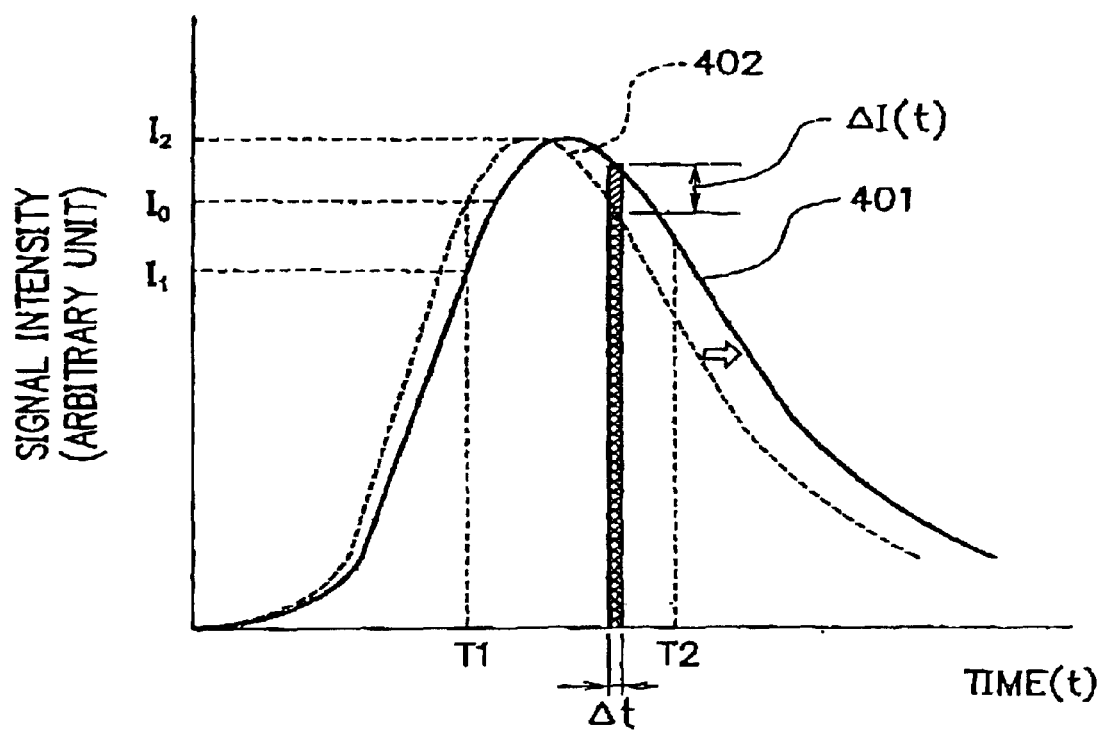
FIG. 4 is a graph showing an output waveform of an irradiance detection circuit and an output waveform of a photoelectric conversion device by means of oscilloscope where the two output waveforms are comparatively shown by normalizing them.

In FIG. 4, reference numeral 401 shows a normalized output waveform of the inspective photoelectric conversion device, and reference numeral 402 shows a normalized output waveform of the irradiance detection circuit in which the reference device is used.

Finally, by altering the values of the R, C, L and the like of the irradiance detection circuit to adjust the light responsive time constant of the irradiance detection circuit, whereby the waveform 402 is adjusted such that it is moved in a direction indicated by a void arrow mark to substantially overlap on the waveform 401 as shown in FIG. 4. In this way, the light responsive time constant of the irradiance detection circuit can be experimentally adjusted without computing the value of the light responsive time constant.

Further, it is desired to make such that the light responsive time constant of the irradiance detection circuit comes closer to the irradiance detection circuit of the photoelectric conversion device, by way of designing or through experiments. That is, it is desired to make the light responsive time constant of the irradiance detection circuit come closer to that of the photoelectric conversion device, such that the difference [for example, ΔI(t) in FIG. 4] between the normalized short-circuit current value by the irradiance detection circuit in which the reference device is used and the normalized short-circuit current value of the photoelectric conversion device, which are measured at any timing during the time when the measurement of the current-voltage characteristics of the photoelectric conversion device is performing (for example, the duration from T1 until T2 in FIG. 4), to fall within a range of ±3%.

By doing in this way, the effective irradiance can be precisely measured at a variation within ±3%. As a result, the correction of the measured current-voltage characteristics of the photoelectric conversion device with respect to the irradiance is performed at a precision with a variation within ±3%, and by this correction, the accuracy of the measured current-voltage characteristics is improved.

The variation of the above-described measured effective irradiance can be regarded as having a temporal instability (±3%) which is equivalent to that by a solar simulator in Class B in the specification of JIS C 8912 for solar simulators for use in measuring crystal series solar cells.

Now, for the above-described ΔI(t), as shown in FIG. 4, when an integration time required for measuring pair of I-V data is made to be Δt, said ΔI(t) indicates a difference between an integrated value of the waveform 401 and that of the waveform 402 during the time Δt. It is preferred that the output of the irradiance detection circuit is also measures with the same integration time. Here, the measurement of each of the waveform 401 and the waveform 402 is necessary to be performed at a time resolution which is smaller than the Δt.

More preferably, it is desired to make the light responsive time constant of the irradiance detection circuit come closer to that of the photoelectric conversion device, such that the foregoing difference ΔI(t) of the normalized short-circuit current values to fall within a range of ±1%. By doing in this way, the effective irradiance can be precisely measured at a variation within ±1%. This can be regarded as having a temporal instability (±1%) which is equivalent to that by a solar simulator in Class A in the specification of JIS C 8912 for solar simulators for use in measuring crystal series solar cells.

In the present invention, it is preferred that the light responsive time constant of the irradiance detection circuit is made to be continuously variable. To make the light responsive time constant of the irradiance detection circuit to be continuously variable may be performed, for instance, by using a variable capacity condenser as the foregoing condenser, a variable resistance as the foregoing resistance, or a variable inductor as the foregoing inductor.

Separately, in the case where it is difficult to make the light responsive time constant of the irradiance detection circuit to be continuously variable due to a factor of the limited adjustable range of the light responsive time constant or the like, it is possible to make the light responsive time constant capable of being discretely changed by connecting a plurality of integrating circuits having a different time constant and switching them by means of a relay.

In the present invention, in the case where the reference device is calibrated, it is preferred that the output from the irradiance detection circuit is calibrated. In that case, it is preferred to use a steady state solar simulator.

Separately, in the case where the foregoing secondary working reference device (b) is used without calibrating the secondary working reference device, the calibrated value of the foregoing primary working reference device (a) is transferred for practical use, after the light responsive time constant of the irradiance detection circuit is made come closer to that of the inspective photoelectric conversion device in accordance with the previously described method, the primary working reference device is arranged at the same position on the light irradiation face (where said inspective photoelectric conversion device is arranged) to which light is irradiated by the solar simulator used in the measurement, and an output value of the irradiance detection circuit including the secondary working reference device when the primary working reference device reproduces the calibrated value is recorded.

[Measuring Means of Current-Voltage Characteristics]

The measuring means for measuring current-voltage characteristics of the inspective photoelectric conversion device comprises a voltage detection means and a current detection means. As the voltage detection means and the current detection means, it is possible to use conventional means such as a means comprising a digital-multiple meter combined with a resistor, a means comprising a analog-digital conversion board (A/D board) combined with a resistor, and the like.

[Voltage Variable Means]

As the voltage variable means for varying the voltage of the inspective photoelectric conversion device, it is possible to use conventional means such as a bipolar power source, electric load, discharging of charge stared in a condenser, and the like.

In order to obtain measured current-voltage characteristics of the inspective photoelectric conversion device in the case where the voltage or the electric current is varied while being controlled, it is necessary to sweep the voltage or the electric current. The sweeping may be performed in a continuously changing manner or a stepwise changing manner. However, with consideration of the time constant to the charge-and-discharge of the inspective photoelectric conversion device, it is preferred to adopt a manner in that the measurement of the I-V data is performed at a measurement interval which is sufficiently longer than the time constant of the charge-and-discharge. This is important particularly in the case where a photoelectric conversion device having a large electrostatic capacity is subjected to the measurement of current-voltage characteristics thereof.

[Measurement Controlling/Data Processing Means]

As the means to control the foregoing measuring instruments and the means to process the measured data, it is desired that a measuring instrument such as a personal computer and a data-processing means capable of exchanging data are used. It is preferred that said data-processing means has a function capable of controlling the measuring instruments and more preferably, it has also a function capable of conduct programing the control of the measuring instruments.

Further, it is desired to make such that the light responsive time constant can be controlled using such measurement controlling/data processing means.

Further in addition, it is desired to make such that the measured data of the current-voltage characteristics of the photoelectric conversion device can be corrected with respect to the irradiance by the detected irradiance and said data can be also corrected with respect to the temperature. Known mathematical expressions can be adopted for the correction with respect to the irradiance and for the correction with respect to the temperature.

Separately, in the present invention, by incorporating the above-described measuring method for measuring current-voltage characteristics of a photoelectric conversion device in part of the production process of a photoelectric conversion device, variations in the characteristics of photoelectric conversion devices produced are refrained to improve the stability of the products in terms of the quality.

Specifically, for instance, in the production process of a solar cell module as an example of a photovoltaic apparatus which is disclosed in Japanese Laid-open Patent Publication No. 2002-252362, as the step of measuring current-voltage characteristics of each of unit devices (that is, so-called solar cells) prior to connecting them in series connection or parallel connection before the resin-sealing step, the measuring method for measuring current-voltage characteristics of a photoelectric conversion device (including a photovoltaic device) of the present invention can be incorporated.

By incorporating the measuring method of the present invention in this way, at the intermediary stage prior to the completion of the production of a photoelectric conversion device (a photovoltaic device), the characteristics of a device in process can be grasped. Thus, defectives can be sorted at early stage in the production process, and only non-defectives sorted can be subjected to the steps thereafter This enables to curtail the expenses and the materials consumed for the defectives. This leads to diminishing the production cost of a photoelectric conversion device (a photovoltaic device).

Further, because the current-voltage characteristics of a photoelectric conversion device (a photovoltaic element) which cannot be always precisely measured mainly due to a influence by the light responsive time constant can be always and more precisely measured. This enables to refrain a variation in the production yield of a photoelectric conversion device (a photovoltaic device) due to errors in the measurement and stabilize the yield. In addition, the accurate measurement of the current-voltage characteristics by the measuring method of the present invention leads to refraining a variation among photoelectric conversion devices (photovoltaic devices) produced with respect to their characteristics and improving the stability of the products in terms of the quality. Further, if necessary, it is possible to properly adjust the conditions to produce a photoelectric conversion device based on the measured values. This leads to more improving the yield. Particularly, for instance, even when abnormality is occurred in the characteristics of a photoelectric conversion device (a photovoltaic device) during the production process thereof due to a certain cause (for instance, shortage of the high frequency power in the plasma CVD process), as the measuring method for measuring the current-voltage characteristic of the photoelectric conversion device of the present invention is incorporated in the intermediary step, the abnormality can be detected at once and a proper measure to comply with the incident can be promptly taken. This enables to decrease the amount of defectivenesses produced during the time of dealing with the incident.

Separately, for instance in the production process of a solar cell module, as the final inspection step of measuring the current-voltage characteristics of a completed solar cell module, the measuring method for measuring current-voltage characteristics of a photoelectric conversion device of the present invention can be incorporated.

By incorporating the measuring method of the present invention as the final inspection step in the production process of a photoelectric conversion device (including a photovoltaic device), the current-voltage characteristics of the photoelectric conversion device can be more precisely measured. This enables to refrain a variation in the yield and stabilize the yield. And for photoelectric conversion devices (the photovoltaic devices) to be shipped, their stability in terms of the quality can be improved.

Further, by incorporating the measuring method for measuring current-voltage characteristics of a photoelectric conversion device (including a photovoltaic device) of the present invention as the inspection step in the intermediary stage and also as the inspection step in the final stage in the production process of a photoelectric conversion device (including a photovoltaic device), in addition to the above-described advantages, the analysis of the influence that the respective production steps exert to the characteristics of the photoelectric conversion device or to the production yield can be easily conducted. This enables to more improve the production yield and to improve the quality of the photoelectric conversion devices to be shipped.

In the following, the present invention will be described in more detail with reference to examples which will be described below. However, it should be understood that these examples are only for the illustrative purposes and are not intended to restrict the scope of the present invention to these examples.

EXAMPLE 1

This example describes an embodiment in that in accordance with the measuring method of the present invention using the measuring system shown in FIG. 1, a photoelectric conversion device to be inspected (hereinafter referred to as "inspective photoelectric conversion device") is measured with respect to current-voltage characteristics thereof.

Figure 5:
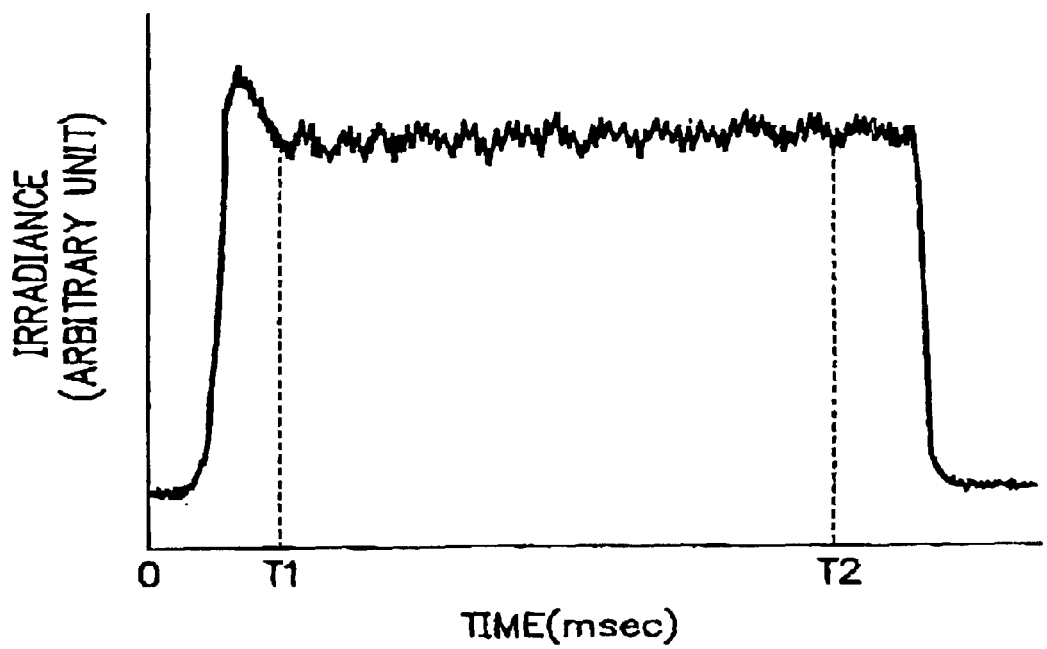
FIG. 5 shows an example of a waveform of pulsed light by a long pulse solar simulator.

In the following, the measuring procedures to measure the inspective photoelectric conversion device will be detailed chiefly with reference to FIGS. 1, 2 and 5.

As the inspective photoelectric conversion device 102, there is used a triple a-Si/a-SiGe/a-SiGe type solar cell module having an aperture area of about 120 cm×35 cm and an outer shape of about 140 cm×42 cm, prepared by providing five triple a-Si/a-SiGe/a-SiGe type solar cells comprising a top cell having a p-i-n junction in which an amorphous silicon (a-Si) is used as an i-type semiconductor layer, a middle cell having a p-i-n junction in which an amorphous silicon-germanium (a-SiGe) is used as an i-type semiconductor layer, and a bottom cell having a p-i-n junction in which an amorphous silicon-germanium (a-SiGe) is used as an i-type semiconductor layer which are stacked in this order on a stainless steel substrate, connecting said five triple type solar cells each other in series connection on a support member while inserting a by-pass diode therein, and sealing the serialized body of the five solar cells by forming a surface protective layer thereon.

As the irradiation light, there is used pulsed light by a long pulse solar simulator having an effective irradiation area of 150 cm×100 cm. FIG. 5 shows a time-varying irradiance waveform of the pulsed light by said long pulse solar simulator.

Description will be made with reference to FIG. 5. The time during which the measurement of current-voltage characteristics of the photoelectric conversion device 102 is performed between the time T1 and the time T2 is about 200 msec, and the average irradiance during this measurement is 1000 W/M$^2$. However, as shown in FIG. 5, the irradiance during the time between the time T1 and the time T2 when the measurement of the current-voltage characteristics is being performed is not stable but is being varied.

The reference device 103 is required to have characteristics which are stable over a long period of time. In view of this, without using a triple type solar cell whose constitution is the same as that of the triple type solar cell of the above triple type solar cell module, a crystal silicon solar cell provided with an optical filter on the light incident side and which has a spectral response approximate to that of aforesaid triple type solar cell (this crystal silicon solar cell will be hereinafter referred to as "reference cell") is used. The reference cell is packed by a known package comprising an aluminum block having a surface treated with black alumite (this package is described in, for example, JIS C 8911). In order to make it possible to adjust the temperature of the reference cell to fall in a range of 25±2° C., a Peltier element was fixed to the outer side of the package. The device prepared in this way is used as the reference device 103.

As the irradiance detection circuit 104, there is used an RC integrating circuit shown in FIG. 2. The series resistor R in the RC integrating circuit shown in FIG. 2 is designed so that part thereof can be used as a shunt resistor to convert the short-circuit current of the reference cell into a voltage.

As each of the voltage detection means 105, the current detection means 106, and the output (voltage) detection means 108, a high speed A/D board is used. As the measurement control/data processing means 109, a personal computer is used.

Data acquired by each of the high speed A/D boards as the voltage detection means 105, the current detection means 106, and the output detection means 108 is introduced into the personal computer as the measurement control/data processing means 109, where the data is processed. Here, the integration time in the measurement of the detected voltage and the detected electric current is made to be 0.1 msec. This means that the measuring time consumed to measure each I-V data of the current-voltage characteristics of the triple type solar cell module as the inspective photoelectric conversion device 102 at every measuring point and the measuring time of the irradiance (the foregoing Δt) are respectively 0.1 msec.

As the voltage variable means 107, a programable bipolar power source is used. By means of the programable bipolar power source as the voltage variable means 107, the voltage applied to the triple type solar cell module as the inspective photoelectric conversion device 102 is swept from the Isc side (where V<0, I>0) toward the Voc side (where V>0, I<0). At this time, after the voltage values for the sweeping set up in accordance with the open-circuit voltage (Voc) of the triple type solar cell module are memorized in the memory of the bipolar power source as the voltage variable means 107 by the personal computer, the applied voltage is stepwise varied at 128 points.

Here, accounting for that the triple type solar cell module as the inspective photoelectric conversion device 102 has a relatively large elctrostatic capacity and the time constant of the charge-and-discharge thereof is large, the time interval to vary the voltage is made to be 1.5 msec, and after the delay time of 1 msec after the set voltage by the bipolar power source is varied, the acquisition of each I-V data of the triple type solar cell is started.

First, in order to make the light responsive time constant of the irradiance detection circuit 104 come closer to that of the triple type solar cell module as the photoelectric conversion device 102, the time constant of the RC integrating circuit is adjusted in the same manner as previously described.

Specifically, while irradiating the pulsed light of the long pulse solar simulator to the irradiance detection circuit 104 and the triple type solar cell module, a change in the short-circuit current value of each of the irradiance detection circuit and the triple type solar cell module is monitored by the oscilloscope.

By adjusting mainly the capacitance C of the condenser 201 of the RC integrating circuit (see, FIG. 2) in accordance with the previously described procedures with reference to FIG. 4, during the measurement of the current-voltage characteristics of the triple type solar cell module, the light responsive time constant of the irradiance detection circuit 104 can be made to come closer to that of the triple type solar cell module so that a difference ΔI(t) between a normalized value of said short-circuit current value of the irradiance detection circuit and a normalized value of said short-circuit current value of the triple type solar call to fall within a range of ±1% of the reference short-circuit current value ($I_0$). At this time, as previously described, as the integration time for the acquisition of each I-V data by the A/D board is 0.1 msec, the Δt in FIG. 4 is also made to be 0.1 msec.

Now, after the light responsive time constant has been once adjusted as above described, when another triple type solar cell module which is of the same type as the above-described triple type solar cell module is used as the inspective photoelectric conversion device 102, the ΔI(t) in that case can be also made to be of an accuracy within a range of ±1%.

Now, after the time constant of the RC integrating circuit was adjusted as above described, the irradiance detection circuit was set to the long pulse solar simulator. Then, in accordance with the below-described procedures, the correction of the irradiance detection circuit in which the reference device is used performed. As the inspective photoelectric conversion device, the foregoing triple type solar cell module was used. Another triple type solar cell module whose constitution and size are the same as those of the inspective triple type solar cell module was provided. This triple type solar cell module was stabilized by subjecting to degradation with light and the triple type solar cell module thus stabilized was made to be a primary working reference device.

Here, irradiation light of the long pulse solar simulator is accompanied by positional unevenness in the irradiance or the spectrum. Because of this, it is important that the primary working reference device is the same as the inspective photoelectric conversion device with respect to the constitution and the size. Therefore, aforesaid triple type solar cell module was used.

Then, the triple type solar cell module as the primary working reference device was taken to the public agency, where a measured value of the short-circuit current thereof was obtained.

(At the time when the measurement was carried out by the public agency, no JIS specification for stacked type solar cells was present. Therefore, the measured value obtained by the public agency is not called a "calibrated value".)

Thereafter, the primary working reference device was set at the position of the long pulse solar simulator, which is the same as the position where the inspective triple type solar cell module is to be set. Then, the pulsed light was irradiated to measure a short-circuit current value of the primary working reference device, where the output voltage of the irradiance detection circuit when the measured short-circuit current value indicated the short-circuit current value measured by the public agency was recorded to replace the former recorded value, whereby the irradiance detection circuit in which the foregoing reference cell is used was calibrated as a secondary working reference device. At this time, the environmental temperature was adjusted so that the temperature of the primary working reference device became 25±1° C. Such calibration is not necessary to be repeated as long as the positional unevenness of the irradiance or the spectrum of the long pulse simulator is not changed, where the irradiance detection circuit can be used.

Next, the triple type solar cell module as the primary working reference device was removed, and the inspective triple type solar cell module was set at the same position, where while monitoring the irradiance of the pulsed light of the long pulse solar simulator by the irradiance detection circuit, the measurement of current-voltage characteristics of the inspective triple type solar cell module was carried out. To be more specific, after the voltage applied thereto was stepwise varied as previously described and a delay time of 1 msec was established, the irradiance and I-V data of the solar cell module were acquired by the A/D board at an integration time of 0.1=sec, where the acquired I-V data for the 128 points from the Isc side toward the Voc side were taken in the personal computer. At this time, by a thermocouple comprising a sheet type copper constantan fired to the back face of the triple type solar cell module, the temperature of the solar cell module during the measurement of the I-V data thereof was measured.

By the irradiance with which the I-V data for the 128 points were concurrently measured, the irradiance correction was carried out for the I-V data at every point. As the correction expression for the irradiance correction, the conventional correction expression described in Item 6.2 of JISC 8913 (measuring method of output of crystal series solar cell). Here, because the irradiance correction was not the correction from data measured with two irradiance levels but the correction only from the data measured with one irradiance level, the correction expression of crystal series solar cell was used. Separately, the value of the series resistance Rs of the solar cell module was obtained by estimating from the gradient of a tangent of the I-V data in the vicinity of the Voc.

Then, the corrected I-V data for the 128 points were subjected to temperature correction by the measured values of the temperature or the solar cell module during the measurement of the I-V data thereof. In the temperature correction, the conventional correction expression described in Item 6.2 of JIS C 8934 (measuring method or output of amorphous solar cell).

The data obtained by the irradiance correction and the temperature correction in the above were processed by the personal computer. As a result, there were obtained current-voltage characteristics (I-V curve) after the correction of the inspective triple type solar cell module as the final result.

In order to examine the accuracy of the resultant current-voltage characteristics, the inspective triple type solar cell module was measured with respect to the current-voltage characteristics thereof under the sunlight outdoors. At this time, the triple type solar cell module was installed on a frame bed capable of tracking the sun, and the foregoing reference cell of the crystal silicon solar cell was also installed on said frame bed, where the irradiance of the sunlight was measured. And the spectrum of the sunlight upon the measurement of the irradiance was also measured. The measurement of the current-voltage characteristics under stable solar irradiation conditions that the weather is fine, the irradiance is in a range of from 800 to 1200 W/m$^2$, and the air mass (AM) is 1.5±0.1 and under condition that the sunlight spectrum measured is approximate to the standard solar radiation. Thus, the measurement of the current-voltage characteristics was carried out under the ideal condition which is approximate to the standard sunlight spectrum and is free of the influence by a variation in the irradiance.

Separately, for the reference cell, the irradiance thereof was computed by comparing with the short-circuit current value measured by the public agency using the steady state light solar simulator, as the calibrated value.

Further, as well as in the case of the foregoing pulsed light, the temperature of the solar cell module during the measurement of the current-voltage characteristics was measured. In addition, in order to prevent the temperature of the solar cell module from rising by the sunlight, the sunlight was shielded until the time when the measurement was started, and immediately before the commencement of the measurement, the sunlight was started radiating to the solar cell module. The reference cell was controlled to have a temperature of 25±2° C. Further, as well as in the case of the foregoing pulsed light, the irradiance correction and the temperature correction were performed for the measured I-V data to obtain a I-V curve after the correction.

Figure 6:
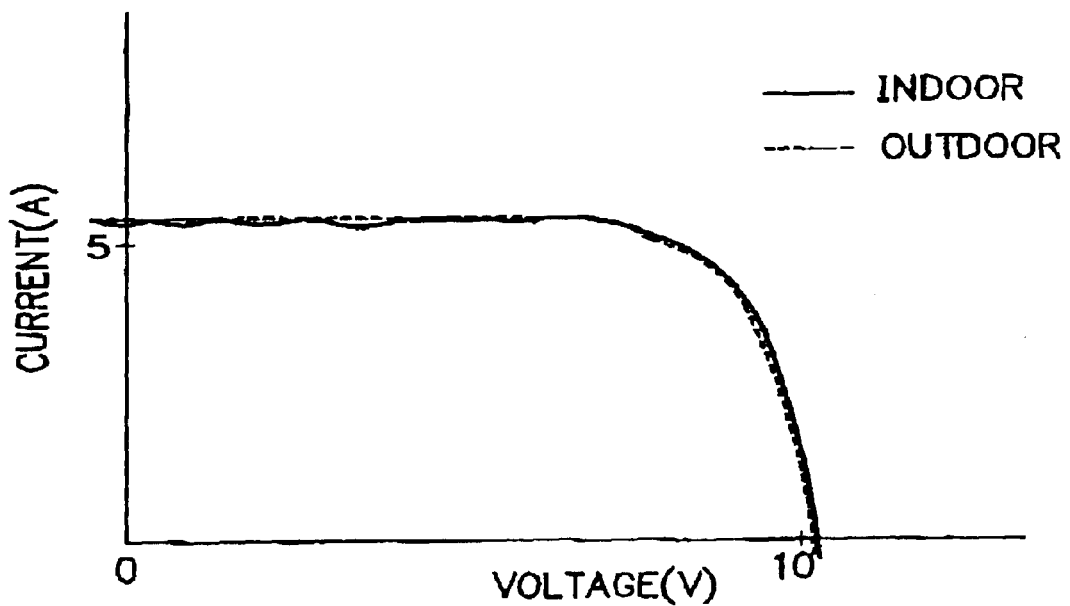
FIG. 6 is a graph showing measured results of the current-voltage characteristics of a photoelectric conversion device in Example 1 which will be described later.

The I-V curve (indoor) after the correction, obtained by using the pulsed light solar simulator in the above and the corrected I-V curve (outdoor) after the correction by using the sunlight are collectively shown in FIG. 6. In FIG. 6, the solid line curve indicates the I-V curve of the indoor measurement and the dotted line curve indicates the I-V curve of the outdoor measurement.

For the output characteristics [Voc (open-circuit voltage), Isc (shore-circuit current), FF (fill factor), and Pmax value] computed from the I-V curve after the correction, those by the pulse light solar simulator are shown in Table 1 as the indoor values, and those by the sunlight are also shown in Table 1 as the outdoor values.

Separately, for each characteristic value, a value of the indoor value/the outdoor value was calculated by setting the outdoor value at 1. The results obtained are also shown in Table 1.

TABLE 1

|  | Voc | Isc | FF | Pmax |
|---|---|---|---|---|
| indoor value | 10.12 V | 5.53 A | 0.665 | 37.2 W |
| outdoor value | 10.08 V | 5.54 A | 0.662 | 37.0 W |
| indoor/outdoor | 1.004 | 0.998 | 1.005 | 1.005 |

As FIG. 6 and Table 1 illustrate, it is understood that the I-V curve after the correction, measured by the pulsed light solar simulator and in accordance with the measuring method of the present invention well agrees with the I-V curve after the correction, measured by the sunlight outdoors. And as the results shown in Table 1 illustrate, it is understood that the output characteristics computed from the I-V curve after the correction, measured by the pulsed light solar simulator well agree with those computed from the measured data by the sunlight.

Further, the I-V curve after the correction, measured by the pulsed light solar simulator is in a smooth curve form. A portion of the I-V curve in the vicinity of the Isc which was considered to be capable of being approximated by a straight line was linearly approximated by the least square method, and a standard deviation of deviations from the regression line of every point of the I-V curve at said portion was computed. As a result, it was 0.15% in a relative value. This result indicates that the effective pulsed light irradiance for the triple type solar cell module was suitably detected by the irradiance detection circuit in which the reference is used and which is a principal feature of the present invention.

As apparent from the above description, the current-voltage characteristics of the triple type solar cell module could be accurately measured.

Comparative Example 1

In Example 1, without using the irradiance detection circuit in which the reference cell is used, the triple type solar cell module was measured by the conventional measuring method wherein the irradiance of the pulsed light solar simulator is directly detected by way of converting the short-circuit current of the reference cell into a voltage by means of the shunt resistor. Except for not using the irradiance detection circuit, the measurement was carried out in the same manner as in Example 1.

Figure 7:
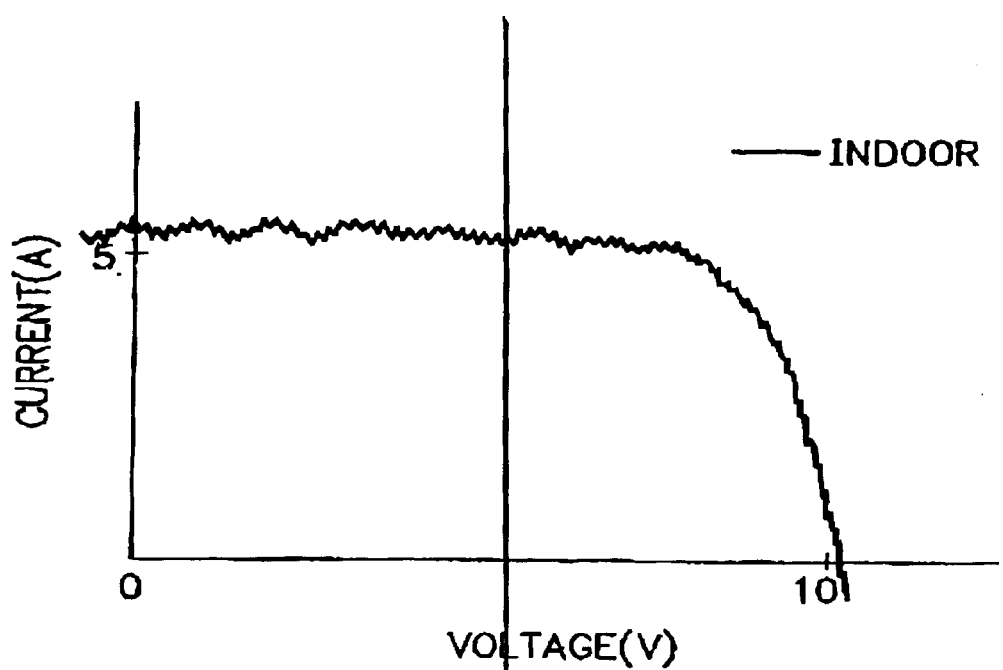
FIG. 7 is a graph showing measured results of the current-voltage characteristics of a photoelectric conversion device in Comparative Example 1 which will be described later.
Figure 8:
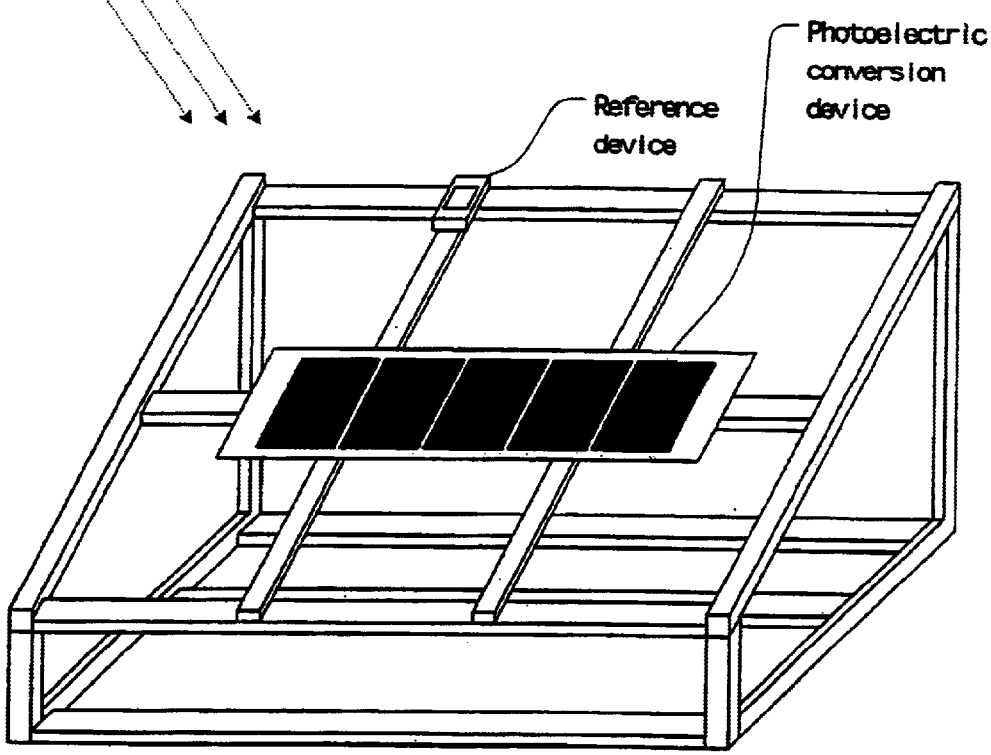
FIG. 8 illustrates light from the sum illuminating both photoelectric conversion device and the reference device at the same angle.

The I-V curve after the correction obtained in this comparative example is shown In FIG. 7.

From the resultant I-V curve after the correction, the output characteristics were computed as well as in Example 1, and the resultant output characteristics are collectively shown in Table 2. The outdoor values shown in Table 2 are the same as those in Example 1.

TABLE 2

|  | Voc | Isc | FF | Pmax |
|---|---|---|---|---|
| indoor value | 10.13 V | 5.42 A | 0.658 | 36.1 W |
| outdoor value | 10.08 V | 5.54 A | 0.662 | 37.0 W |
| indoor/outdoor | 1.005 | 0.978 | 0.994 | 0.976 |

As well as in Example 1, a portion of the I-V curve in the vicinity of the Isc which was considered to be capable of being approximated by a straight line was linearly approximated by the least square method, and a standard deviation of deviations from the regression line of every point of the I-V curve at said portion was computed. As a result, it was 1.2% in a relative value.

From the above results, it is understood that the I-V curve after the correction, measured by the pulsed light solar simulator in accordance with the conventional measuring method is accompanied by roughness as apparent from FIG. 7 and the above standard deviation. And as apparent from Table 2, it is understood that the output characteristics computed from the I-V curve after the correction distinguishably differ from the outdoor values at the maximum deviation of 2.4%.

In order to compare the light responsibility of the triple type solar cell module with that of the reference cell including the shunt resistor, evaluation was performed by monitoring a variation in the short-circuit current by the oscilloscope while irradiating the pulsed light of the long pulse solar simulator. As a result, the foregoing $\Delta I(t)$ of the normalized short-circuit current values during the measurement of the current-voltage characteristics was 3.6% at the maximum versus the foregoing reference short-circuit current value $I_0$.

For the causes why the I-V curve after the correction was accompanied by such roughness and the indoor values after the correction distinguishably differs, it is considered such that the light responsibility of the reference cell distinguishably differed from that of triple type solar cell module and because of this, the detection of the effective irradiance could not be well performed.

EXAMPLE 2

As well as in Example 1, the measurement of a triple type solar cell module which is the same as the triple type solar cell module used in Example 1 was carried out using the measuring system shown in FIG. 1, except that the RL integrating circuit shown in FIG. 3 was used instead of the RC integrating circuit used as the irradiance detection circuit in which the reference cell is used in Example 1.

In this example, in order to make the light responsive time constant of the irradiance detection circuit to come closer to that of the triple type solar cell module, the time constant of RL integrating circuit was adjusted in the same manner as in Example 1.

As a result, there was obtained a smooth I-V curve after the correction as well as in Example 1.

A portion of the I-V curve in the vicinity of the Isc side which was considered to be capable of being approximated by a straight line was linearly approximated by the least square method, and a standard deviation of deviations from the regression line of every point of the I-V curve at said portion was computed. As a result, the standard deviation was 0.17% in a relative value. And the values of the output characteristics computed from the I-V curve after the correction, measured by the pulsed light solar simulator well agreed with those computed from the I-V curve after the correction measured by the sunlight with a difference within ±1%.

EXAMPLE 3

As well as in Example 1, the measurement of a triple type solar cell module which is the same as the triple type solar cell module used in Example 1 was carried out using the measuring system shown in FIG. 1, except that a photoelectric conversion device was used instead of the RC integrating circuit used as the irradiance detection circuit in which the reference cell is used in Example 1.

As the photoelectric conversion device, there was used a triple type solar cell whose constitution is the same as that of the triple type solar cell of the triple type solar cell module used in Example 1. Provided that in this triple type solar cell (hereinafter referred to as "time constant-adjusting cell"), a shield was provided so as to prevent light from being impinged therein. The time constant-adjusting cell is connected with the reference cell of the irradiance detection circuit in parallel connection in a forward direction such that the positive electrodes of the two cells are connected. In this case, when light is impinged in the reference cell, photoelectric current is generated in the reference cell.

Here, the time constant-adjusting cell is not irradiated with light and therefore, it has no photoelectric current. Thus, until the time when the photoelectric current generated in the reference cell is flown into the time constant-adjusting cell and it is saturated therein, building-up of the photoelectric current to flow in the shunt resistor is delayed. That is, the time constant-adjusting cell functions as a condenser so as to increase the light responsive time constant as the irradiance detection circuit in a magnitude corresponding to the time constant of charging the condenser with the photoelectric current or the reference cell.

Here, the electrostatic capacity C can be changed when the time constant-adjusting cell is made to have a large effective area or the time constant-adjusting cell is made to comprise a plurality of time constant-adjusting cells comprising a triple type solar cell whose constitution is the same as that of the triple type solar cell of the triple type solar cell module used in Example 1 are connected in a parallel connection.

A thin film semiconductor photoelectric conversion device such as the triple type solar cell used in this example as the time constant-adjusting cell has a large electrostatic capacity per a unit area, and therefore, it can be suitably used as the condenser whose electrostatic capacity is large.

Now, in order to make the light responsive time constant of the irradiance detection circuit to come closer to that of the inspective triple type solar cell module, the light responsive time constant of the irradiance detection circuit was properly adjusted by using the most suitable time constant-adjusting cell selected from a plurality of time constant-adjusting cells having a different time constant by way of testing them one after the other while monitoring the short-circuit current by the oscilloscope as Well as in Example 1.

As a result, there was obtained a smooth I-V curve after the correction as well as in Example 1.

A portion of the I-V curve in the vicinity of the Isc wide which was considered to be capable of being approximated by a straight line was linearly approximated by the least square method, and a standard deviation of deviations from the regression line of every point of the I-V curve at said portion was computed. As a result, the standard deviation was 0.19% in a relative value. And the values of the output characteristics computed from the I-V curve after the correction, measured by the pulsed light solar simulator well agreed with those computed from the I-V curve after the correction measured by the sunlight with a difference within ±1%.

EXAMPLE 4

In this example, the measuring procedures by means of the measuring system shown in FIG. 1 in Example 1 were repeated, except that the condenser of the RC integrating circuit of the irradiance detection circuit in which the reference cell is used was changed to a variable capacitance condenser, the solar simulator was changed to a short pulse solar simulator having an effective irradiation area of 130 cm×80 cm, and instead of the triple type solar cell module as the inspective photoelectric conversion device, a tandem type solar cell module was used. Thus, in this example, the tandem type solar cell module was measured with respect to current-voltage characteristics thereof.

The tandem type solar cell module used in this example is a tandem type solar cell module having an aperture area of about 120 cm×35 cm and an outer shape of about 140 cm×42 cam prepared by providing ten tandem [amorphous silicon (a-Si)/microcrystal silicon ($\mu$c-Si)] type solar cells comprising a top cell having a p-i-n junction in which an amorphous silicon (a-Si) is used as an i-type semiconductor layer and a bottom cell having a p-i-n junction in which a microcrystal silicon ($\mu$c-Si) is used as an i-type semiconductor layer which are stacked in this order on a stainless steel substrate, connecting said ten tandem type solar cells each other in series connection on a support member while inserting a by-pass diode therein, and sealing the serialized body of the ten solar cells by forming a surface protective layer thereon.

As the optical filter for approximating the spectral response of the reference cell to that of the tandem type solar cell module, there was used an optical filter which is different from that used in Example 1.

The duration of pulsed light of the short pulse solar simulator is about 1 msec and said pulsed light has such a waveform as shown in FIG. 4.

The measurement of current-voltage characteristics of the tandem type solar cell module was performed by the multiple pulse method wherein when the irradiance detected by the irradiance detection circuit reaches a prescribed value, a trigger is applied to measure the voltage and current of the tandem type solar cell module, where I-V data for one point with respect to one pulse are acquired.

Here, the emission interval of the pulsed light is 80 msec. Therefore, there was adopted such a manner that the interval during which a voltage is stepwise applied to the tandem type solar cell module is made to be 80 msec, and immediately after the pulsed light emission is terminated, the voltage applied to the tandem type solar cell module is varied.

And the integration time (the previously described $\Delta t$) for each of the detection of the irradiance and the detection of the voltage and current of the tandem type solar cell module was made to be 0.02 msec.

In this example, in order to make the light responsive time constant of the irradiance detection circuit to come closer to that of the tandem type solar cell module, the time constant of the RC integrating circuit was adjusted as well as in Example 1. At this time, by changing the condenser of the RC integrating circuit of the irradiance detection circuit in which the reference cell is used to the variable capacitance condenser as above described, it made possible to properly adjust the time constant of the RC integrating circuit by continuously changing the time constant while watching the monitor of the oscilloscope. Thus, the light responsive time constant of the irradiance detection circuit could be readily adjusted as required.

Separately, to have changed the condenser of the RC integrating circuit of the irradiance detection circuit in which the reference cell is used to the variable capacitance condenser provides other advantage such that even when the kind of the inspective photoelectric conversion device is changed and the light responsive time constant of the irradiance detection circuit becomes necessary to be readjusted, it is possible to readily deal with this situation.

By the way, in this example, due to the factors that the duration of the pulsed light is short, the change rate of the pulsed light per a unit time (the time-differentiated value of the irradiance) is relatively large and the integration time ($\Delta t$) is relatively small, the noise of the monitoring by the oscilloscope became somewhat large and because of this, the previously described difference $\Delta I(t)$ of the two normalized short-circuit current values was within $\pm 1.5\%$ of the reference short-circuit current value $I_0$.

As a result of the measurement in this example, there was obtained a smooth I-V curve after the correction as well as in Example 1.

A portion of the I-V curve in the vicinity of the Isc side which was considered to be capable of being approximated by a straight line was linearly approximated by the least square method, and a standard deviation of deviations from the regression line of every point of the I-V curve at said portion was computed. As a result, the standard deviation was 0.22% in a relative value. And the values of the output characteristics computed from the I-V curve after the correction, measured by the pulsed light solar simulator well agreed with those computed from the I-V curve after the correction measured by the sunlight with a difference within $\pm 1.2\%$.

EXAMPLE 5

In this example, the measuring procedures by means of the measuring system shown in FIG. 1 in Example 1 were repeated, except that the measurement was carried out outdoors by using the sunlight as the irradiation light and instead of the triple type solar cell module as the inspective photoelectric conversion device, an amorphous silicon solar cell module was used. Thus, in this example, the amorphous silicon solar cell module was measured with respect to current-voltage characteristics thereof.

The amorphous silicon solar cell module used in this example is an amorphous silicon solar cell module having an outer shape of about 40 cm×85 cm, prepared by providing 21 submodules having a size of 10 cm×10 cm prepared by forming an amorphous silicon (a-Si) cell having a p-i-n junction in which an amorphous silicon is used as an i-type semiconductor layer on a glass substrate and sealing the resultant by a surface protective layer, serializing every three of the 21 submodules to form seven serialized bodies and connecting the seven serialized bodies in parallel connection.

As the optical filter for approximating the spectral response of the reference cell to that of the amorphous silicon solar cell module, there was used an optical filter which is different from that used in Example 1.

Because the measurement in this example was carried out outdoors, the amorphous silicon solar cell module and the irradiance detection circuit were installed on a frame bed capable of tracking the sun which was placed outdoors. The measurement of the current-voltage characteristics of the amorphous silicon solar cell module was carried out under condition that the weather was not fine such that it has some clouds where the irradiance of the sunlight was unstable.

The irradiance was computed by comparing a short-circuit current value of the irradiance detection circuit with the calibrated value obtained by the public agency beforehand where the irradiance detection circuit having the reference cell arranged therein was subjected to the measurement of the short-circuit current using the steady state light solar simulator, as the calibrated value.

Further, the temperature of the amorphous silicon solar cell module was measured as well as in Example 1, and in order to prevent the temperature of the solar cell module from rising by the sunlight, the sunlight was shielded until the time when the measurement was started, and immediately before the commencement of the measurement, the sunlight was started radiating to the solar cell module. The reference cell was controlled to have a temperature of $25\pm 2°$ C.

Separately, in order to make the light responsive time constant of the irradiance detection circuit to come closer to that of the amorphous silicon solar cell module, the time constant of the RC integrating circuit was previously adjusted as required by using pulsed light, as well as in Example 1.

In order to examine the accuracy of the resultant current-voltage characteristics, the inspective amorphous silicon solar cell module was measured with respect to the current-voltage characteristics thereof outdoors under stable solar irradiation conditions that the weather is fine, the irradiance is in a range of from 800 to 1200 W/m$^2$, and the air mass (AM) is 1.5±0.1, as well as in Example 1. That is, the measurement of the current-voltage characteristics was carried out under the ideal condition that is approximate to the reference solar radiation and is free of the influence by a variation in the irradiance.

As a result of the measurement in this example, there was obtained a smooth I-V curve after the correction even under the condition that the weather has some clouds such that the irradiance of the sunlight was unstable. And the standard deviation of deviations from the regression line of every point of the I-V curve at a position of the I-V curve in the vicinity of the Isc was 0.11% in a relative value, which is satisfactory. And the values of the output characteristics computed from the I-V curve after the correction well agreed with those computed from the I-V curve after the correction obtained by the outdoor measurement under the ideal condition that is approximate to the reference solar radiation and is free of the influence by a variation in the irradiance, with a difference within $\pm 1\%$.

As will be understood from the above description, the present invention provides various significant advantages as will be described below.

(1) In the method for measuring current-voltage characteristics of an inspective photoelectric conversion device by irradiating light to said photoelectric conversion device and a reference device at the same time while detecting an irradiance of said light using said reference device, by adopting a method of using an irradiance detection circuit in which the reference device is used and adjusting a light responsive time constant of the irradiance detection circuit in which the reference device is used so that the light responsive time constant of the irradiance detection circuit comes closer to that of the photoelectric conversion device, even in the case where the irradiance of the irradiation light is varied with time, a change in the effective irradiance which complies with a given light responsive speed of the photoelectric conversion device can be precisely measured. This enables to accurately perform the irradiance correction for the measured current-voltage characteristics of the photoelectric conversion device. The current-voltage characteristics of the photoelectric conversion device which have received the irradiance correction becomes accurate. In the case where the irradiation light is light which is varied with time, the effect in that the measured results of the current-voltage characteristics of the photoelectric conversion device become accurate is significant.

(2) In the case where pulsed light by an artificial light is used as the irradiation light, the measuring method of the present invention makes it possible to accurately measure a photoelectric conversion device with respect to the current-voltage characteristics thereof indoors, even when the photoelectric conversion device has a large area. For instance, in the case where a plurality of photoelectric conversion devices are produced and they are examined by means of an inspection instrument to measure their photoelectric conversion outputs, when the measuring method is adopted in the inspection instrument, the examination accuracy of the inspection instrument is improved and the examination performance thereof is stabilized and because of this, the yield of the products is stabilized.

(3) In the case where the sunlight is used as the irradiation light, even when the irradiance is varied with time depending on the meteorological condition, the measuring method of the present invention makes it possible to accurately measure current-voltage characteristics of a photoelectric conversion device. Accordingly, for instance in the case where the photoelectric conversion device is installed outdoors and the measurement of the current-voltage characteristics thereof is intended to be carried out, the measuring method of the present invention makes it possible to accurately measure the current-voltage characteristics even when the meteorological condition is not such that the weather is fine and the irradiance of the sunlight is stable. The measuring opportunity is greatly increased.

(4) By using an integrating circuit in the irradiance detection circuit in which the reference device is used, it is possible that the light responsive time constant of the irradiance detection circuit is readily increased so as to come closer to the light responsive time constant of the photoelectric conversion device.

(5) As a component of aforesaid integrating circuit, by using a photoelectric conversion device which is different from the reference device, the range within which the light responsive time constant of the irradiance detection circuit is to be adjusted can be enlarged. Thus, even in the case where the inspective photoelectric conversion device is a photoelectric conversion device whose light responsive time constant is large, the light responsive time constant of the irradiance detection circuit can be readily made to come closer to that of the photoelectric conversion device, where the current-voltage characteristics of the photoelectric conversion device can be accurately measured.

(6) In the measuring method of the present invention, by continuously varying the light responsive time constant of the irradiance detection circuit, it is possible to more accurately measure the current-voltage characteristics of the photoelectric conversion device. Also in the case where a plurality of photoelectric conversion devices having a different light responsive time constant are intended to be measured with respect to their current-voltage characteristics in a short period of time, their current-voltage characteristics can be accurately measured in a short period of time by continuously varying the light responsive time constant of the irradiance detection circuit.

(7) In the measuring method of the present invention, by making the light responsive time constant of the irradiance detection circuit in which the reference device is used to come closer to that of the photoelectric conversion device so that a difference between a normalized short-circuit current value by the irradiance detection circuit in which the reference device is used and a normalized short-circuit current value of the photoelectric conversion device, which are measured at an optional timing during the time when the current-voltage characteristics of the photoelectric conversion device are measuring, to fall within a range of ±3%, a change in the effective irradiance which complies with a given light responsive speed of the photoelectric conversion device can be precisely measured at an accuracy within ±3%, even when the irradiation light is varied with time. Because of this, the irradiance correction for the current-voltage characteristics of the photoelectric conversion device can be carried out at an accuracy within ±3% to improve the accuracy of the current-voltage characteristics after the correction. Separately, the variation of the above-described measured effective irradiance can be regarded as having a temporal instability (±3%) which is equivalent to that by a solar simulator in Class B in the specification of JIS C 8912 for solar simulators for use in measuring crystal series solar cells.

What is claimed is:

1. A method for measuring current-voltage characteristics of a photoelectric conversion device comprising irradiating light to said photoelectric conversion device and to a reference device corresponding to said photoelectric conversion device at the same time, detecting an irradiance of said light using said reference device, and adjusting a light responsive time constant of an irradiance detection circuit connected to said reference device so that said time constant of said irradiance detection circuit comes closer to a light responsive time constant of said photoelectric conversion device.

2. The method according to claim 1, wherein said light is light whose irradiance is varied with time.

3. The method according to claim 1, wherein said light is pulsed light by an artificial light source.

4. The method according to claim 1, wherein said light is the sunlight.

5. The method according to claim 1, wherein the step of adjusting said time constant of the irradiance detection circuit is effected by coupling an integrating circuit in said irradiance detection circuit, so that said light responsive time constant of the irradiance detection circuit is increased to come closer to said light responsive time constant of said photoelectric conversion device.

6. The method according to claim 5, wherein as said integrating circuit, an RC integrating circuit is used.

7. The method according to claim 5, wherein as said integrating circuit, an RL integrating circuit is used.

8. The method according to claim 5, wherein said integrating circuit contains a component comprising a semiconductor device or a photoelectric conversion device which is different from the reference device.

9. The method according to claim 8, wherein said component comprises another photoelectric conversion device which is different from the reference device and also different from the photoelectric conversion device to be measured.

10. The method according to claim 1, wherein said light responsive time constant of said irradiance detection circuit in which said reference device is used is continuously changed.

11. The method according to claim 1, wherein said light responsive time constant of said irradiance detection circuit in which said reference device is used is made to come closer to that of said photoelectric conversion device so that a difference between a normalized short-circuit current value by the irradiance detection circuit in which the reference device is used and a normalized short-circuit current value of said photoelectric conversion device, which are measured at any timing during the time when the current-voltage characteristics of the photoelectric conversion device are being measured, to fall within a range of ±3%.

12. An apparatus for measuring current-voltage characteristics of a photoelectric conversion device, comprising a reference device corresponding to said photoelectric conversion device for receiving light from a same source and at the same time as light applied to said photoelectric conversion device, an irradiance detection circuit connected to said reference device, a means for measuring said current-voltage characteristics of said photoelectric conversion device, and a means for changing a light responsive time constant of said irradiance detection circuit in which said reference device is used.

13. The apparatus according to claim 12, wherein said light is received from an artificial light source which generates pulsed light.

14. The apparatus according to claim 12, further comprising means for installing said photoelectric conversion device and said reference device outdoors so that they face to the sunlight at a substantially equal angle.

15. The apparatus according to claim 12, wherein said irradiance detection circuit in which said reference device is used has an integrating circuit.

16. The apparatus according to claim 15, wherein said integrating circuit is an RC integrating circuit.

17. The apparatus according to claim 15, wherein said integrating circuit is an RL integrating circuit.

18. The apparatus according to claim 15, wherein said integrating circuit contains a component comprising a semiconductor device.

19. The apparatus according to claim 18, wherein said component comprises another photoelectric conversion device which is different from said reference device and also different from said photoelectric conversion device.

20. The apparatus according to claim 12, wherein said means for changing said light responsive time constant of said irradiance detection circuit in which said reference device is used is a means for continuously changing said light responsive time constant.

21. A process for producing a photoelectric conversion device, comprising a step (a) of forming at least one photoelectric conversion portion on a substrate to obtain a photoelectric conversion device and a step (b) of measuring current-voltage characteristics of said photoelectric conversion device, characterized in that said step (b) includes a step of providing an irradiance detection circuit connected to a reference device corresponding to said photoelectric conversion device, and a step of adjusting a light responsive time constant of said irradiance detection circuit so that said light responsive time constant of said irradiance detection circuit comes closer to a light responsive time constant of said photoelectric conversion device.

22. The process according to claim 21, wherein said photoelectric conversion device has at least one semiconductor junction composed of a thin film semiconductor.

23. The process according to claim 21, wherein said step (b) is situated in an intermediary stage of said plurality of steps for producing said photoelectric conversion device.

24. The process according to claim 21, wherein based on a measured value in the step of measuring the current-voltage characteristics of the photoelectric conversion device, the condition of at least one step of forming the photoelectric conversion device is adjusted so that said value falls in a prescribed range.

25. An apparatus for producing a photoelectric conversion device, comprising a means (i) for forming at least one photoelectric conversion portion on a substrate to obtain a photoelectric conversion device and a means (ii) for measuring current-voltage characteristics of said photoelectric conversion device, characterized in that said means (ii) has a means for irradiating light to said photoelectric conversion device and to a reference device corresponding to said photoelectric conversion device at the same time, an irradiance detection circuit connected to said reference device, and a means for changing a light responsive time constant of said irradiance detection circuit in which said reference device is used.

* * * * *

UNITED STATES PATENT AND TRADEMARK OFFICE
CERTIFICATE OF CORRECTION

PATENT NO. : 6,946,858 B2
DATED : September 20, 2005
INVENTOR(S) : Jinsho Matsuyama It is certified that error appears in the above-identified patent and that said Letters Patent is hereby corrected as shown below:

Column 1,
Line 12, "as" should read -- as a --; and
Line 28, "wherein" should read -- wherein an --.

Column 2,
Line 12, "entire" should read -- entire area --.

Column 3,
Line 33, "enspective" should read -- inspective --.

Column 4,
Line 16, "respect" should read -- respect to --;
Line 38, "device" should read -- device, --;
Line 39, "large" should read -- large, --;
Line 41, "film" should read -- film, --;
Line 47, "FIG. 7" should read -- FIG. 7, --;
Line 66, "condition" should read -- conditions --; and
Line 67, "unstable" should read -- unstable, --; and "sunlight" should read -- sunlight, --.

Column 5,
Line 2, "apparatus" should read -- apparatus, --;
Line 3, "characteristics" should read -- characteristics, --;
Line 4, "light" should read -- light, --; and
Line 5, "unstable" should read -- unstable, --; and "sunlight" should read -- sunlight, --.

Column 8,
Line 3, "description" should read -- a description --;
Line 49, "can" should read -- can be --; and
Line 67, "those" should read -- whose --.

Column 9,
Line 1, "respect" should read -- respect to --;
Line 20, "an" should read -- in --;
Line 25, "intention" should read -- invention --; and
Line 58, "there" should read -- where --.

Column 11,
Line 25, "other" should read -- another --;
Line 42, "Mismatch" should read -- mismatch --;
Line 53, "Qs($\lambda$);" should read -- Qs($\lambda$): --; and
Line 56, "where" should read -- with --.

UNITED STATES PATENT AND TRADEMARK OFFICE
CERTIFICATE OF CORRECTION

PATENT NO. : 6,946,858 B2
DATED : September 20, 2005
INVENTOR(S) : Jinsho Matsuyama It is certified that error appears in the above-identified patent and that said Letters Patent is hereby corrected as shown below:

Column 12,
Line 9, "current voltage" should read -- current-voltage --.

Column 13,
Line 25, "ref rence" should read -- reference --;
Line 42, "similar 3" should read -- similar --; and
Line 63, "make" should read -- taken --.

Column 14,
Line 2, "deviation" should read -- of a deviation --;
Line 10, "possible" should read -- possible to have --;
Line 26, "(6)" should read -- (6). --;
Line 48, "means" should read -- mean --;
Line 65, "lager." should read -- larger. --; and
Line 67, "designed" should read -- design --.

Column 15,
Line 6, "below" should read -- below. --.

Column 16,
Line 2, "pair" should read -- a pair --;
Line 6, "measures" should read -- measured --; and
Line 47, "made" should read -- made to --.

Column 17,
Line 39, "be also" should read -- also be --;
Line 64, "at" should read -- at an --; and
Line 66, "thereafter" should read -- thereafter. --.

Column 18,
Line 5, "be always" should read -- always be --;
Line 6, "be" should read -- always --;
Line 7, "always and" should read -- be --; and "refrain" should read -- refrain from --; and
Line 13, "refraining" should read -- refraining from --;
Line 26, "step, the" should read -- step. The --; and
Line 41, "refrain" should read -- refrain from --.

Column 19,
Line 21, "cells" should read -- cells to --.

UNITED STATES PATENT AND TRADEMARK OFFICE
CERTIFICATE OF CORRECTION

PATENT NO.    : 6,946,858 B2
DATED         : September 20, 2005
INVENTOR(S)   : Jinsho Matsuyama It is certified that error appears in the above-identified patent and that said Letters Patent is hereby corrected as shown below:

Column 20,
Line 54, "call" should read -- cell --; and
Line 66, "be also" should read -- also be --.

Column 21,
Line 5, "performed." should read -- is performed. --;
Line 19, "aforesaid" should read -- the aforesaid --; and
Line 61, "fired" should read -- fixed --.

Column 22,
Line 17, "expression" should read -- expression is --.

Column 25,
Line 60, "Well" should read -- well --; and
Line 63, "wide" should read -- side --.

Column 26,
Line 26, "cmx42 cam" should read -- cmx 42 cm, --.

Signed and Sealed this

Twenty-first Day of March, 2006

JON W. DUDAS
*Director of the United States Patent and Trademark Office*